US012749662B2

(12) United States Patent
Park et al.

(10) Patent No.: US 12,749,662 B2
(45) Date of Patent: Sep. 29, 2026

(54) SUPPORTING UNIT AND APPARATUS FOR TREATING SUBSTRATE

(71) Applicant: SEMES CO., LTD., Cheonan-si (KR)

(72) Inventors: Tae Dong Park, Hwaseong-si (KR); Chung Woo Lee, Suwon-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1073 days.

(21) Appl. No.: 17/892,244

(22) Filed: Aug. 22, 2022

(65) Prior Publication Data

US 2023/0060901 A1 Mar. 2, 2023

(30) Foreign Application Priority Data

Aug. 25, 2021 (KR) ........................ 10-2021-0112129

(51) Int. Cl.

| | |
|---|---|
| ***H01L 21/306*** | (2006.01) |
| ***H01J 37/32*** | (2006.01) |
| ***H05B 1/02*** | (2006.01) |
| ***H05B 3/28*** | (2006.01) |

(52) U.S. Cl.

CPC ...... *H01J 37/32724* (2013.01); *H05B 1/0233* (2013.01); *H05B 3/283* (2013.01); *H01J 2237/2007* (2013.01); *H05B 2203/005* (2013.01)

(58) Field of Classification Search

CPC ........... H01J 37/32724; H01J 37/32715; H01J 37/32522; H01J 2237/2007; H05B 2203/005

See application file for complete search history.

(56) References Cited

U.S. PATENT DOCUMENTS

| | | | | |
|---|---|---|---|---|
| 2012/0097661 | A1* | 4/2012 | Singh | H05B 1/0233 219/446.1 |
| 2020/0214087 | A1* | 7/2020 | Zhao | H01L 21/67103 |
| 2020/0402778 | A1* | 12/2020 | Yamada | H01J 37/32146 |
| 2021/0366696 | A1* | 11/2021 | Lee | H01L 21/6831 |

FOREIGN PATENT DOCUMENTS

| | | | |
|---|---|---|---|
| CN | 102668058 | A | 9/2012 |
| CN | 111223737 | A | 6/2020 |
| CN | 111385915 | A | 7/2020 |
| JP | 2019-176138 | A | 10/2019 |
| KR | 101919675 | B1 | 2/2019 |

OTHER PUBLICATIONS

Office Action for Chinese Application No. 202211029035.9 dated Feb. 8, 2025.

* cited by examiner

*Primary Examiner* — Luz L Alejandro Mulero

(74) *Attorney, Agent, or Firm* — Harness, Dickey & Pierce, P.L.C.

(57) ABSTRACT

The inventive concept provides a support unit for supporting a substrate. The support unit for supporting the substrate includes a first plate; heating elements provided at the first plate for controlling a temperature of respective region of the substrate; a power supply module configured to generate at least two powers having a different frequency; a power line transmitting a power generated by the power supply module to the heating elements; and filters installed at the power line to selectively filter a power supplied to the heating elements.

5 Claims, 22 Drawing Sheets

SUPPORTING UNIT AND APPARATUS FOR TREATING SUBSTRATE

CROSS-REFERENCE TO RELATED APPLICATIONS

A claim for priority under 35 U.S.C. § 119 is made to Korean Patent Application No. 10-2021-0112129 filed on Aug. 25, 2021, in the Korean Intellectual Property Office, the entire contents of which are hereby incorporated by reference.

BACKGROUND

Embodiments of the inventive concept described herein relate to a support unit and a substrate treating apparatus, more specifically, a support unit for adjusting a temperature of a supported substrate and a substrate treating apparatus including the same.

A plasma refers to an ionized gas state made of ions, radicals, electrons, or the like and is generated by a very high temperature, a strong electric field, or an RF electronic field. A semiconductor device manufacturing process performs various processes using the plasma. For example, the semiconductor device manufacturing process may include an etching process of removing a thin film on a substrate using the plasma, a deposition process of depositing a film on the substrate using the plasma, etc.

In this way, a plasma substrate treating apparatus for treating a substrate such as a wafer using the plasma requires an accuracy to accurately perform a substrate treatment, a repetitive reproducibility to maintain a constant treating degree between substrates even when several substrates are treated, and a uniformity to uniformize a treating degree at an entire region of a single substrate.

Meanwhile, with a development of a semiconductor device manufacturing technology, a diameter of a substrate to be treated tends to increase, and a critical dimension (CD) of a pattern formed on the substrate tends to gradually decrease. This enlargement of the substrate and a refinement of the pattern make it difficult to secure a treatment uniformity for the substrate.

SUMMARY

Embodiments of the inventive concept provide a support unit and a substrate treating apparatus for efficiently treating a substrate.

Embodiments of the inventive concept provide a support unit and a substrate treating apparatus for improving a treatment uniformity of a substrate.

Embodiments of the inventive concept provide a support unit and a substrate treating apparatus capable of independently performing a temperature adjustment of a substrate according to a region of the substrate.

Embodiments of the inventive concept provide a support unit and a substrate treating apparatus capable of independently performing a substrate heating according to a region of the substrate even without a complex connection structure.

The technical objectives of the inventive concept are not limited to the above-mentioned ones, and the other unmentioned technical objects will become apparent to those skilled in the art from the following description.

The inventive concept provides a support unit for supporting a substrate. The support unit includes a first plate; heating elements provided at the first plate for controlling a temperature of respective region of the substrate; a power supply module configured to generate at least two powers having a different frequency; a power line transmitting a power generated by the power supply module to the heating elements; and filters installed at the power line to selectively filter a power supplied to the heating elements.

In an embodiment, the heating elements are grouped into a plurality of groups, each group including at least one heating element, and the filters are connected to corresponding group of heating element.

In an embodiment, a frequency range filtered by at least one of the filters is different from a frequency range filtered by another at least one of the filters.

In an embodiment, the heating elements are arranged in a M×N matrix.

In an embodiment, at least a first portion of the heating elements are disposed at a center region of the plate, and at least a second portion of the heating elements are disposed at an edge region of the plate.

In an embodiment, the heating elements disposed at the edge region of the plate are spaced apart from one another along a circumferential direction of the plate.

In an embodiment, the power supply module includes: a power source; and at least one frequency conversion member connected to the power source and configured to convert a power generated by the power source to a power having a specific frequency.

In an embodiment, the power supply module further comprises a frequency synthesizing member selectively connected to the at least one frequency conversion member.

In an embodiment, the first plate includes: an insulation layer within which the heating elements are buried; and a dielectric layer within which an electrode clamping the substrate in a static manner is buried, and wherein the support unit further comprises a second plate disposed below the dielectric layer and the insulation layer and having a fluid channel through which a cooling fluid flows.

In an embodiment, about 50% to 90% of the top surface are of the support unit are occupied by the heating elements.

In an embodiment, at least a portion of the filters are band pass filters.

The inventive concept provides a support unit for supporting a substrate. The support unit includes heating elements including a first heating element for controlling a temperature of a first region of the substrate and a second heating element for controlling a temperature of the second region, the second region is a different from the first region; a power supply module configured to generate a first power having a first frequency and/or a second power having a second frequency; a power supply line connected to the power supply module and the heating elements; a power return line connected to the heating elements and a ground; a first filter installed at the power supply line to pass one of the first power and the second power; and a second filter installed at the power supply line to pass the other of the first power and the second power.

In an embodiment, the support unit further includes a plate, and wherein the plate includes: a dielectric layer provided with an electrostatic electrode; and an insulation layer in which the heating elements are provided.

In an embodiment, the first filter and the second filter are disposed outside the insulation layer.

In an embodiment, the insulation layer includes: a first insulation layer positioned below the dielectric layer and provided with the first heating element and the second heating element; and a third insulation layer positioned below the first insulation layer, and wherein the power supply line is provided in the first insulation layer, the power supply line is provided in the third insulation layer, and a conductive via is provided to electrically connect the heating elements and the power return line.

In an embodiment, the insulation layer includes: a first insulation layer positioned below the dielectric layer and provided with the heating elements; and a second insulation layer positioned at a height different from the first insulation layer, and wherein the power supply line is provided in the first insulation layer and connected to first conductive vias, and the power return line is provided in the second insulation layer and connected to second conductive vias, and wherein the first conductive vias are electrically connected to at least one first lead which passes through a first hole formed at a cooling plate positioned below the plate, and the second conductive vias are electrically connected to at least one second lead which passes through a second hole formed at the cooling plate.

In an embodiment, the insulation layer includes: a first insulation layer positioned below the dielectric layer and provided with the heating elements; a third insulation layer positioned at a height which is different from a height of the first insulation layer, the power supply line being provided in the third insulation layer; a fourth insulation layer positioned at a height which is different from the height of the first insulation layer and a height of the second insulation layer, the power return line being provided in the fourth insulation layer, and wherein the support unit further includes: first conductive vias electrically connecting the heating elements and the power supply line; and second conductive vias electrically connecting the heating elements and the power return line.

The inventive concept provides a substrate treating apparatus. The substrate treating apparatus includes a chamber providing a treating space for treating a substrate therein; a support unit configured to support the substrate at the treating space; and a plasma source configured to generate a plasma for treating the substrate at the treating space, and wherein the support unit includes: heating elements configured to control a temperature of the substrate, the heating elements being independently operable; a power supply module configured to generate at least two powers having a different frequency; power supply lines connecting the power supply module to the heat elements; power return lines connecting the heating elements to a ground; and filters installed at the power supply lines.

In an embodiment, each of the heating elements is connected to any one of the power supply lines and any one of the power return lines, and wherein the heating elements do not share a same one of the power supply lines and a same one of the power return lines.

In an embodiment, a rectifier is installed at the power supply line or the power return line, the rectifier preventing a current transmitted from the power supply module from flowing in a reverse direction.

According to an embodiment of the inventive concept, a substrate may be efficiently treated.

According to an embodiment of the inventive concept, a treatment uniformity of a substrate may be improved.

According to an embodiment of the inventive concept, a temperature adjustment can be independently performed according to a region of a substrate.

According to an embodiment of the inventive concept, a heating of a substrate according to a region of the substrate can be independently performed even without a complex connection structure.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
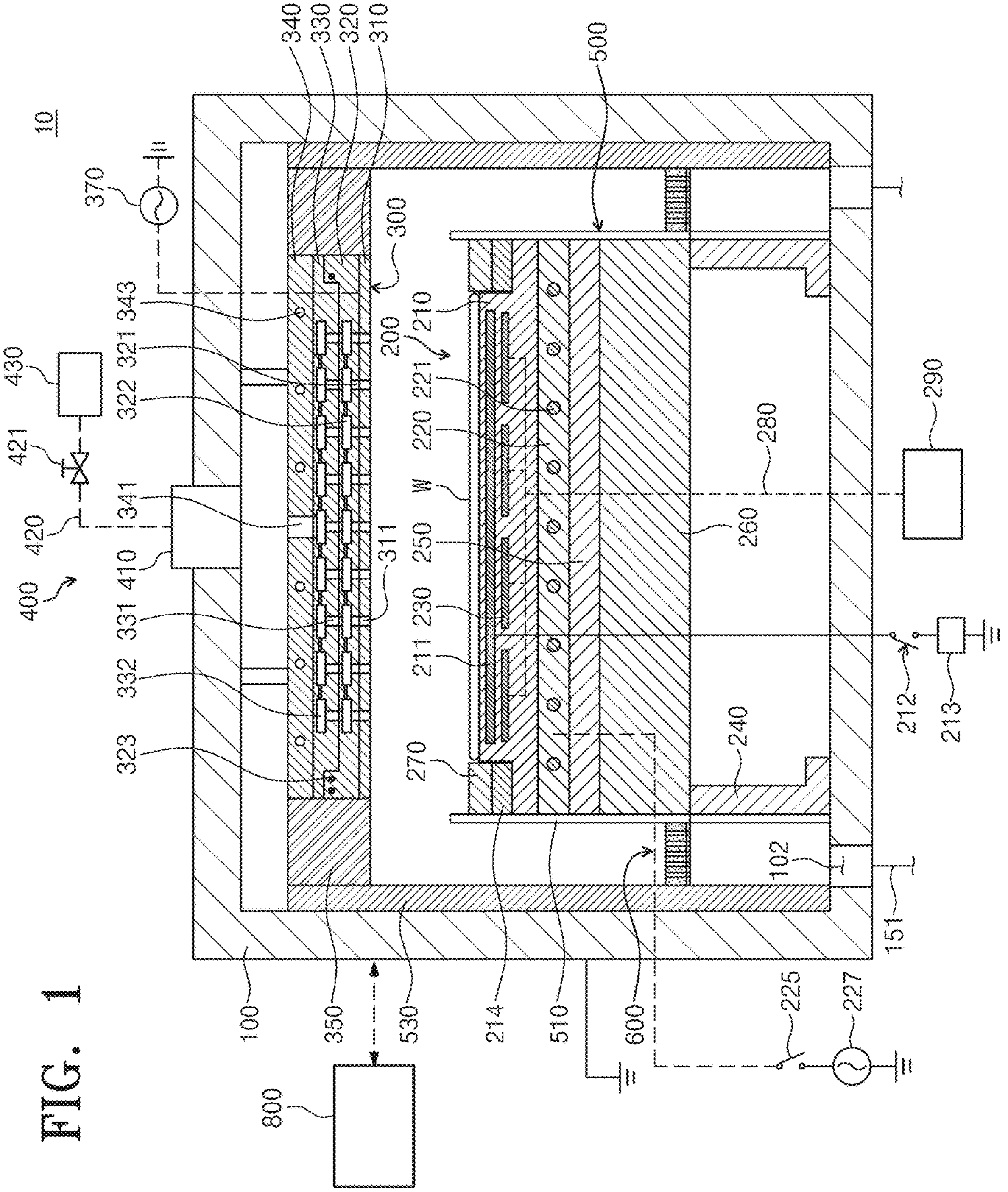
FIG. 1 illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In an embodiment of the inventive concept, a substrate treating apparatus for etching a substrate using a plasma is illustrated. However, the inventive concept is not limited thereto, and may be applied to various kinds of apparatuses that perform a process of supplying the plasma into a chamber.

Hereinafter, an embodiment of the inventive concept will be described with reference to FIG. 1 to FIG. 22.

A First Exemplary Embodiment

FIG. 1 illustrates a substrate treating apparatus according to an embodiment of the inventive concept.

Referring to FIG. 1, the substrate treating apparatus 10 treats a substrate W using a plasma. The substrate treating apparatus 10 may include a chamber 100, a support unit 200, a shower head unit 300, a gas supply unit 400, a plasma source, a liner unit 500, a baffle unit 600, and a controller 800.

The chamber 100 provides a treating space in which a substrate treatment process is performed. The chamber 100 has an inner treating space. The chamber 100 is provided in a sealed form. The chamber 100 is made of a metal material. In an embodiment, the chamber 100 may be made of an aluminum material. The chamber 100 may be grounded. An exhaust hole 102 is formed on a bottom of the chamber 100. The exhaust hole 102 is connected to an exhaust line 151. The exhaust line 151 is connected to a pump (not shown). The reaction by-products generated during a process and a gas remaining in an inner space of the chamber 100 may be discharged to an outside through the exhaust line 151. An inside of the chamber 100 is depressurized to a preset pressure by the exhaust process.

A heater (not shown) is provided in a wall, for example, a side wall of the chamber 100. The heater heats the side wall of the chamber 100. The heater is electrically connected to a heating power source (not shown). The heater may be configured to undergo Joule heating (which is also known as ohmic/resistive heating) upon the application of an electric current thereto by the heating power source. For example, the heater may be configured to produce heat when an electric current passes therethrough. Heat generated by the heater is transferred to the inner space. The treating space is maintained at a preset temperature by the heat provided by the heater. The heater is provided as a coil-shaped heating wire. One or a plurality of heaters may be provided on in the side wall of the chamber 100.

The support unit 200 may support the substrate W in the treating space of the chamber 100. The support unit 200 may be an electrostatic chuck ESC that adsorbs the substrate W such as a wafer in an electrostatic manner. Selectively, the support unit 200 may clamp the substrate W in various ways, such as a mechanical clamping or a clamping by a vacuum adsorption.

Also, the support unit 200 may control a temperature of a supported substrate W. For example, the support unit 200 may increase a treating efficiency of the substrate W by increasing the temperature of the substrate W.

The support unit 200 may include a support plate 210 (an exemplary first plate), an electrode plate 220 (an exemplary second plate), a heater 230, a bottom support 240, an insulation plate 250, a ring member 270, a power line module 280, and a power supply module 290.

The substrate W may be placed on the support plate 210. The support plate 210 may have a disk form when viewed from above.

In some embodiments, a top surface of the support plate 210 may have a same radius as the substrate W. In some embodiments, the top surface of the support plate 210 may have a radius larger than that of the substrate W. When the substrate W is placed on the support plate 210, an edge region of the substrate W may not protrude to an outside of the support plate 210. In addition, an edge region of the support plate 210 may be stepped. An insulator 214 may be disposed at the edge region of the support plate 210 which is stepped. The insulator 214 may have a ring form when viewed from above.

Figure 2:
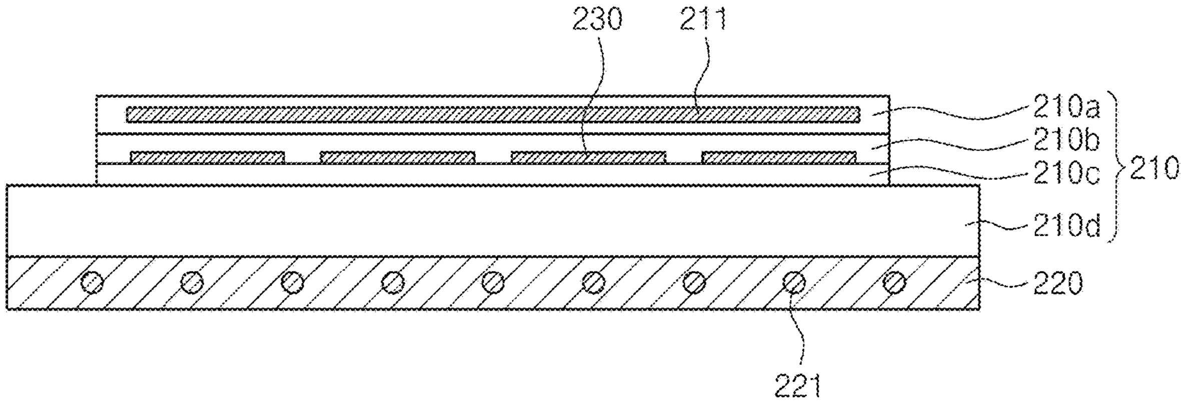
FIG. 2 is an enlarged view illustrating a part of a support unit of FIG. 1.

FIG. 2 is an enlarged view illustrating a portion of the support unit of FIG. 1.

Referring to FIG. 2, the support plate 210 can includes a dielectric layer 210*a*, a first insulation layer 210*b*, a second insulation layer 210*c*, and a heat insulation layer 210*d*.

An electrostatic electrode 211 may be provided in the dielectric layer 210*a*. For example, the electrostatic electrode 211 may be buried in the dielectric layer 210*a*. The electrostatic electrode 211 may be provided in a mono-polar type or a bipolar type. The electrostatic electrode 211 may be electrically connected to an electrostatic power source 213. The electrostatic power source 213 may be a DC power source. A clamping switch 212 may be installed between the electrostatic electrode 211 and the electrostatic power source 213. The electrostatic electrode 211 may be electrically connected to the electrostatic power source 213 by an on/off of the clamping switch 212. When the clamping switch 212 is turned on, a DC current may be applied to the electrostatic electrode 211. An electrostatic force may be generated between the electrostatic electrode 211 and a substrate W by a current applied to the electrostatic electrode 211. The substrate W may be clamped to the support plate 210 by the electrostatic force. The dielectric layer 210*a* may be formed of a material including a dielectric. For example, the dielectric layer 210*a* may be made of or comprise a material including a ceramic.

The first insulation layer 210*b* and the second insulation layer 210*c* may be combined with each other to form a cavity. There may be a plurality of cavities formed by the first insulation layer 210*b* and the second insulation layer 210*c*. The first insulation layer 210*b* may be disposed below the dielectric layer 210*a*. The second insulation layer 210*c* may be disposed below the first insulation layer 210*b*. A groove upwardly recessed (i.e., recessed toward the dielectric layer 210 *a*) is formed in the first insulation layer 210*b*, and the second insulation layer 210*c* is disposed below the first insulation layer 210*b* to form the cavities therebetween. A heating element 230 may be disposed in each of the cavities formed by the first insulation layer 210*b* and the second insulation layer 210*c*. Although FIG. 2 illustrates that the groove is formed at the first insulation layer 210*b*, the second insulation layer 210*c* may have grooves and/or both the first insulation layer 210 *b* and the second insulation layer 210*c* may have grooves. The first insulation layer 210*b* and the second insulation layer 210*c* may be a polymer material, an inorganic material, a ceramic, for example, a silicon oxide, an alumina, an yttrium, an aluminum nitride, other suitable materials, and/or combinations thereof.

The heat insulation layer 210*d* may be disposed below the second insulation layer 210*c*. The heat insulation layer 210*d* may function as a thermal barrier. For example, it is possible to minimize a transfer of a heat generated by the heating element 230 to a bottom portion of the support unit 200. In addition, it is possible to minimize a transfer of a coldness of a cooling fluid flowing in a top fluid channel 221, which is a cooling fluid channel, to the insulation layers 210*b* and 210*c* where the heating element 230 is disposed.

The heating element 230 may control a temperature of the substrate W. The heating element 230 may heat the substrate W. The heating element 230 may generate a heat by receiving a power generated by a power supply module 290 to be described later through a power line module 280. The heating element 230 may be disposed in a cavity formed by the first insulation layer 210*b* and the second insulation layer 210*c*. A plurality of heating elements 230 may be provided. For example, the heating elements 230 may each heat different regions of the substrate W, respectively. For example, a first portion of the heating elements 230 may heat a first region of the substrate W. In addition, a second portion of the heating elements 230 may heat a second region of the substrate W.

The heating elements 230 may be arranged to control a temperature of each of the regions of the substrate W. In addition, the heating element 230 may have a plate shape. For example, the heating element 230 may be referred to as a heating plate. Each heating element 230 may have various shapes such as a rectangular shape, a pentagonal shape, etc. In addition, the heating element 230 may be a resistive heater, such as a polyimide heater, a silicone rubber heater, a mica heater, a metal heater, a ceramic heater, a semiconductor heater, or a carbon heater.

In addition, an area of the heating element 230 may be larger than or corresponding to an area of a die manufactured on the substrate W. For example, each heating element 230 may be sized such that its top surface entirely covers the top surface of corresponding die which will be manufactured on the substrate W. For example, the top surface area of each heating element 230 may be 2 $cm^2$ to 3 $cm^2$. In addition, a thickness of each heating element 230 may range from 2 micrometers to 1 millimeter, and more particularly, from 5 micrometers to 80 micrometers. In addition, when viewed from above, a total area occupied by the heating elements 230 may be 50% to 90% of an area of a top surface of the support unit 200, for example, the top surface of the support plate 210. For example, when viewed from above, the total area occupied by the heating elements 230 may be 90% of a top surface of the support plate 210.

The electrode plate 220 may be provided below the support plate 210. A top surface of the electrode plate 220 may be in contact with a bottom surface of the support plate 210. The electrode plate 220 may have a disk shape. The electrode plate 220 is made of a conductive material. In an embodiment, the electrode plate 220 may be made of an aluminum material. A top fluid channel 221 which is a channel through which a cooling fluid flows may be formed within the electrode plate 220. The top fluid channel 221 mainly cools the support plate 210. A cooling fluid may be supplied to the top fluid channel 221. In an embodiment, the cooling fluid may a cooling water or a cooling gas. In addition, the electrode plate 220 may be a cooling plate. In addition, in the above-described example, the top fluid channel 221 that is the cooling fluid channel through which the cooling fluid flows is formed at the electrode plate 220, but the cooling plate may be provided separately from the electrode plate 220. For example, the cooling plate may be disposed above or below the electrode plate 220, a fluid channel through which the cooling fluid flows may be formed in the cooling plate, and the electrode plate 220 may not have a top fluid channel 221 formed therein.

Referring back to FIG. 1, the electrode plate 220 may be provided as a metal plate. The electrode plate 220 may be electrically connected to a bottom power source 227. The bottom power source 227 may be provided as a high frequency power source for generating a high frequency power. The high frequency power source may be provided as an RF power source. The RF power source may be provided as a high bias power RF power source. The electrode plate 220 may selectively receive the high frequency power from the bottom power source 227 by switching the bottom switch 225. Selectively, the electrode plate 220 may be grounded.

An insulation plate 250 may be disposed below the electrode plate 220. The insulation plate 250 may be provided in a circular plate form. The insulation plate 250 may be provided with an area corresponding to that of the electrode plate 220. The insulation plate 250 may be provided as an insulation plate. In an embodiment, the insulation plate 250 may be provided as a dielectric.

The bottom support 240 is disposed below the electrode plate 220. The bottom support 240 is disposed below the bottom plate 260. The bottom support 240 is provided in a ring shape.

The bottom plate 260 is disposed below the insulation plate 250. The bottom plate 260 may be made of an aluminum material. The bottom plate 260 may be provided in a circular form when viewed from above. The bottom plate 260 may have an inner space. A lift pin module (not shown) that moves the substrate W from an external transfer member to the support plate 210, etc. can be positioned in the inner space of the bottom plate 260.

The ring member 270 is disposed at an edge region of the support unit 200. The ring member 270 has a ring form. The ring member 270 is provided to surround a top portion of the support plate 210. The ring member 270 may be provided on the insulator 214 disposed in the edge region of the support plate 210. The ring member 270 may be provided as a focus ring.

The shower head unit 300 is disposed above the support unit 200 inside the chamber 100. The shower head unit 300 is positioned to face the support unit 200. The shower head unit 300 includes a shower head 310, a gas injection plate 320, a cover plate 330, a top plate 340, and an insulation ring 350.

The shower head 310 is positioned to be spaced downwardly apart from a top surface of the chamber 100 by a preset distance. The shower head 310 is disposed above the support unit 200. A preset space is formed between the shower head 310 and the top surface of the chamber 100. The shower head 310 may be provided in a plate form having a constant thickness. A bottom surface of the shower head 310 may be anodized to prevent an arc generation due to a plasma. A cross-section of the shower head 310 may be provided to have a same form and cross-sectional area as the support unit 200. The shower head 310 includes a plurality of injection holes 311. The injection hole 311 penetrates the top and bottom surfaces of the shower head 310 in an up/down direction.

The shower head 310 may be made of a material that reacts with a plasma generated from a gas supplied by the gas supply unit 400 to generate a compound. For example, the shower head 310 may be provided as a material that reacts with an ion having a highest electronegativity among ions included in the plasma to generate a compound. For example, the shower head 310 may be made of a material including a silicon. In addition, the compound produced by a reaction between the shower head 310 and plasma may be a silicon tetrafluoride.

The shower head 310 may be electrically connected to the top power source 370. The top power supply 370 may be provided as a high frequency power supply. Selectively, the shower head 310 may be electrically grounded.

The gas injection plate 320 is positioned on a top surface of the shower head 310. The gas injection plate 320 is positioned to be spaced apart from the top surface of the chamber 100 by a preset distance. The gas injection plate 320 may be provided in a plate form having a constant thickness. A heater 323 is provided in an edge area of the gas injection plate 320. The heater 323 heats the gas injection plate 320.

The gas injection plate 320 is provided with a diffusion region 322 and an injection hole 321. The diffusion region 322 evenly spreads a gas supplied from above to the injection hole 321. The diffusion region 322 is connected to the injection hole 321 disposed below. Adjacent diffusion regions 322 are connected to each other. Adjacent injection hole 321 is connected to the diffusion region 322 and penetrates a bottom surface in a top/down direction.

The injection hole 321 is positioned to face the injection hole 311 of the shower head 310. The gas injection plate 320 may include a metal material.

The cover plate 330 is positioned above the gas injection plate 320. The cover plate 330 may be provided in a plate form having a constant thickness. The cover plate 330 is provided with a diffusion region 332 and an injection hole 331. The diffusion region 332 evenly spreads the gas supplied from above to the injection hole 331. The diffusion region 332 is connected to the injection hole 331 disposed below. Adjacent diffusion regions 332 are connected to each other. The injection hole 331 is connected to the diffusion region 332 and penetrates the bottom surface in the top/down direction.

The top plate 340 is disposed above the cover plate 330. The top plate 340 may be provided in a plate form having a constant thickness. The top plate 340 may have the same size as the cover plate 330. A supply hole 341 is formed in a center of the top plate 340. The supply hole 341 is a hole through which a gas passes. The gas passing through the supply hole 341 is supplied to the diffusion region 332 of the cover plate 330. A cooling fluid channel 343 is formed within the top plate 340. The cooling fluid may be supplied to the cooling fluid channel 343. In an embodiment, the cooling fluid may be provided as a cooling water.

Also, the shower head 310, the gas injection plate 320, the cover plate 330, and the top plate 340 may be supported by a rod. For example, the shower head 310, the gas injection plate 320, the cover plate 330, and the top plate 340 may be coupled to each other and supported by the rod fixed to a top surface of the top plate 340. In addition, the rod may be coupled to an inside of the chamber 100.

The insulation ring 350 is disposed to surround a circumference of the shower head 310, the gas injection plate 320, the cover plate 330, and the top plate 340. The insulation ring 350 may be provided in a circular ring form. The insulation ring 350 may be made of a non-metallic material. The insulation ring 350 is positioned to overlap the ring member 270 when viewed from above. When viewed from above, a surface where the insulation ring 350 and the shower head 310 are in contact is positioned to overlap a top region of the ring member 270.

The gas supply unit 400 supplies a gas to inside of the chamber 100. The gas supplied by the gas supply unit 400 may be excited to a plasma state by a plasma source. In addition, the gas supplied by the gas supply unit 400 may be a gas containing a fluorine. For example, the gas supplied by the gas supply unit 400 may be a carbon tetrafluoride.

The gas supply unit 400 includes a gas supply nozzle 410, a gas supply line 420, and a gas storage unit 430. The gas supply nozzle 410 is installed at a center of the top surface of the chamber 100. An injection hole is formed on a bottom surface of the gas supply nozzle 410. The injection port supplies a process gas into the chamber 100. The gas supply line 420 connects the gas supply nozzle 410 to the gas storage unit 430. The gas supply line 420 supplies the process gas stored at the gas storage unit 430 to the gas supply nozzle 410. A valve 421 is installed at the gas supply line 420. The valve 421 opens and closes the gas supply line 420 and adjusts a flow rate of the process gas supplied through the gas supply line 420.

The plasma source excites the process gas in the chamber 100 in the plasma state. In an embodiment of the inventive concept, a capacitively coupled plasma (CCP) source is used as the plasma source. The capacitively coupled plasma source may include a top electrode and a bottom electrode inside the chamber 100. The top electrode and the bottom electrode may be disposed vertically in parallel with each other in the chamber 100. One electrode among both electrodes may apply a high frequency power, and the other electrode may be grounded. An electromagnetic field is formed in a space between both electrodes, and a process gas supplied to the space may be excited to the plasma state. A substrate W treatment process is performed using this plasma. According to an embodiment, the top electrode of the CCP source may be provided as the shower head unit 300, and the bottom electrode of the CCP source may be provided as the electrode plate described above. The high frequency power may be applied to the bottom electrode, and the top electrode may be grounded. Alternatively, the high-frequency power may be applied to both the top electrode and the bottom electrode. Accordingly, an electromagnetic field is generated between the top electrode and the bottom electrode. A generated electromagnetic field excites the process gas provided into the chamber 100 to the plasma state.

A liner unit 500 prevents an inner wall of the chamber 100 and the support unit 200 from being damaged during a process. The liner unit 500 prevents impurities generated during the process from being deposited on the inner wall and the support unit 200. The liner unit 500 includes an inner liner 510 and an outer liner 530.

The outer liner 530 is provided on the inner wall of the chamber 100. The outer liner 530 has a space in which a top surface and a bottom surface are open. The outer liner 530 may be provided in a cylindrical form. The outer liner 530 may have a radius corresponding to an inner surface of the chamber 100. The outer liner 530 is provided along the inner surface of the chamber 100.

The outer liner 530 may be made of an aluminum material. The outer liner 530 protects an inner surface of the body 110. In a process of exciting the process gas, an arc discharge may be generated in the chamber 100. The arc discharge damages the chamber 100. The outer liner 530 protects the inner surface of the body 110 to prevent the inner surface of the body 110 from being damaged by the arc discharge.

The inner liner 510 is provided to surround the support unit 200. The inner liner 510 is provided in a ring form. The inner liner 510 is provided to surround all of the support plate 210, the electrode plate 220, and the bottom support 240. The inner liner 510 may be made of an aluminum material. The inner liner 510 protects an outer surface of the support unit 200.

A baffle unit 600 is positioned between the inner wall of the chamber 100 and the support unit 200. The baffle is provided in an annular ring form. A plurality of through holes are formed at the baffle. A gas provided in the chamber 100 passes through the through holes of the baffle and is exhausted through the exhaust hole 102. A flow of the gas may be controlled according to a form of the baffle and a form of the through holes.

A controller 800 may control a substrate treating apparatus 10. The controller 800 may control the substrate treating apparatus 10 such that the substrate treating apparatus 10 performs a plasma treating process on the substrate W. Also, the controller 800 may control a power supply module 290 to be described later. In addition, the controller 800 may control the power supply module 290 to be described later to perform a heating on a plurality of regions of the substrate W.

The controller 800 may comprise a process controller consisting of a microprocessor (computer) that executes a control of the substrate treating apparatus 10, a user interface such as a keyboard via which an operator inputs commands to manage the substrate treating apparatus 10, and a display showing the operation situation of the substrate treating apparatus 10, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 3:
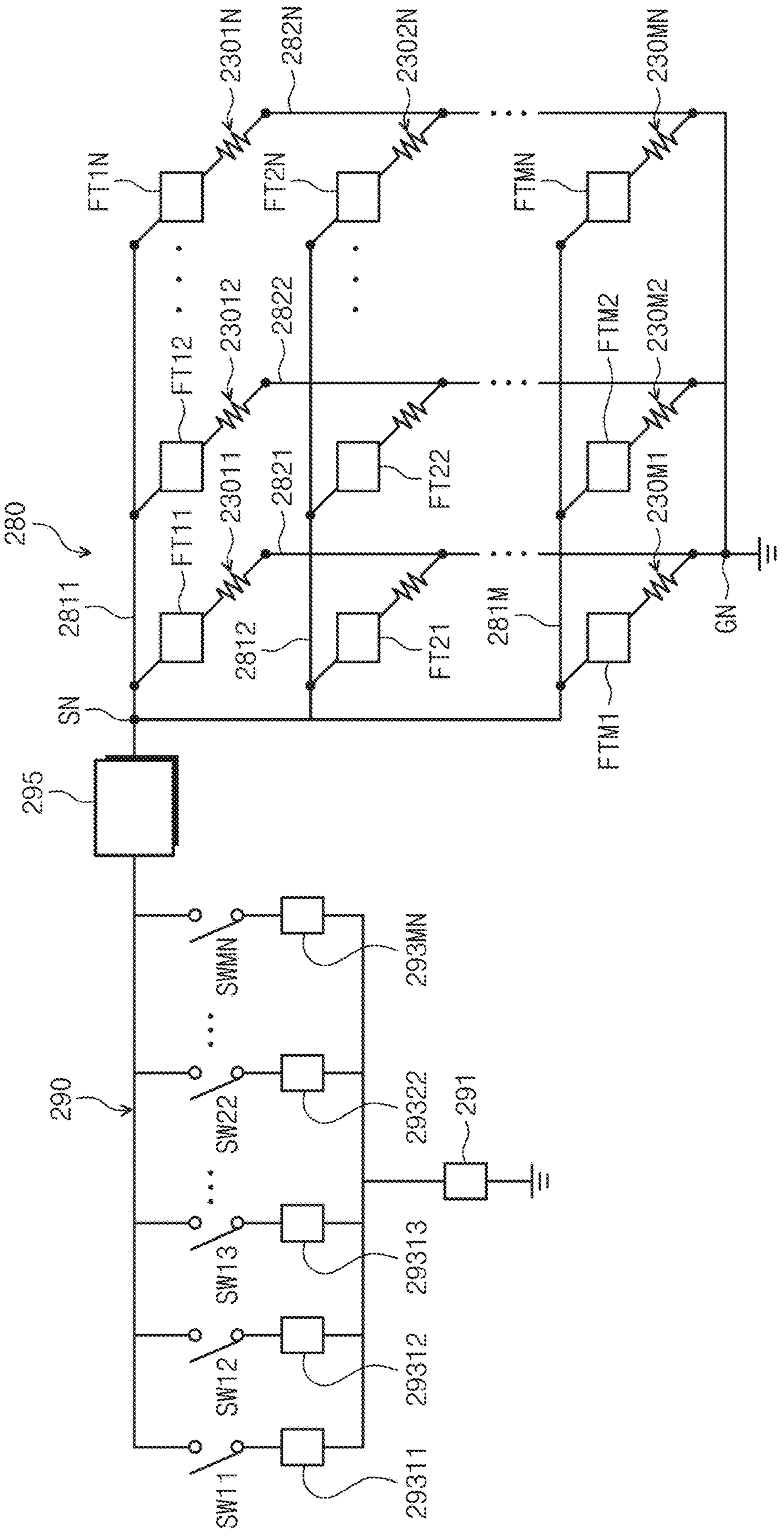
FIG. 3 is schematically illustrates a power line module, a power supply module, a filter, and heating elements of the support unit according to a first embodiment of the inventive concept.

FIG. 3 schematically illustrates a power line module, a power supply module, a filter, and heating elements of a support unit according to a first embodiment of the inventive concept.

Referring to FIG. 3, the heating elements 230 may be arranged to control temperatures of different regions of the substrate W. The heating elements 230 may be arranged in a matrix pattern to control a temperature of each of the regions of the substrate W. The heating elements 230 may be provided in an M×N array. For example, 16 heating elements 230 may be provided in a 4×4 array. However, the inventive concept is not limited thereto, and a total number of heating elements 230 may be variously changed as necessary.

Hereinafter, in M×N array of the heating elements, the heating element 230 at the Mth row and Nth column may be referred to as an M-N heating element 230MN. For example, the heating element 230 at the first row and first column of M×N array may be referred to as a 1-1 heating element 23011. The heating element 230 at the first row and the second column will be referred to as a 1-2 heating element 23012. The heating element 230 at the third row and the first column may be referred to as a 3-1 heating element 23031.

The power line module 280 may transmit a power generated by the power supply module 290 to the heating elements 230. The power line module 280 may include a power supply line 281 and a power return line 282.

The power supply line 281 may transmit the power generated by the power supply module 290 to the heating element 230. The power supply module 280 may be configured to generate at least two or more powers having different frequencies. The power return line 282 may connect the heating elements 230 to a ground, i.e., ground the heating elements 230.

The power supply line 281 may be electrically connected to a supply node SN connected to the power supply module 290. Also, the power supply line 281 may be electrically connected to a plurality of heating elements 230, e.g., input side of the heating element. For example, the power supply line 281 may be electrically connected to the heating elements 230 disposed in a same row.

A plurality of power supply lines 281 may be provided. For example, the power supply line 281 may be provided with a number of M, which is the number of rows of the M×N array of the heating elements. For example, the power supply line 281 electrically connected to the group of heating elements 230 disposed in the first row of the M×N array may be referred to as the first power supply line 2811. In addition, the power supply line electrically connected to the group of the heating element 230 disposed in the second row of the M×N array may be referred to as the second supply line 2812. Also, the power supply line electrically connected to the group of heating elements 230 disposed in the M row of the M×N array can be referred to as the M power supply line 281M.

The power return line 282 may be electrically connected to a ground node GN to be grounded. In addition, the power return line 282 may be electrically connected to the plurality of heating elements 230, e.g., the output side of the heating element. For example, the power return line 282 may be electrically connected to the heating elements 230 disposed in a same column.

A plurality of power return lines 282 may be provided. For example, a number of N power return lines 282 may be provided, which are the number of column of the M×N array of the heating elements. For example, the power return line 282 electrically connected to a group of the heating elements 230 disposed in a first column of the M×N array may be referred to as a first power return line 2821. In addition, the power return line 282 electrically connected to the group of heating elements 230 disposed in the first column of the M×N array may be referred to as a second power return line 2822. Also, the power supply line electrically connected to the group of heating elements 230 disposed in an Nth column of the M×N array can be referred to as an Nth power return line 282N.

In addition, no two heating elements 230 are connected to a same one of the power supply lines 281 and a same one of the power return lines 282. For example, for the 1-1 heating element 23011, it may be electrically connected to the first power supply line 2811 and electrically connected to the first power return line 2821. For the 1-2 heating element 23012, it can be electrically connected to the first power supply line 2811 and electrically connected to the second power return line 2822. Comparing the 1-1 heating element 23011 and the 1-2 heating element 23012 with each other, the first power supply line 2811 is shared, but the power return line 282 is not shared. This is to independently control a heat generation of each heating element 230, while preventing a connection between the power supply line 281 and the power return line 282 from becoming complicated. If the connection between the power supply line 281 and the power return line 282 becomes complicated, problems such as a short circuit may frequently occur, and a maintenance may be difficult. However, according to an embodiment of the inventive concept, each of the heating elements 230 are connected to any one of the power supply lines 281 and any one of the power return lines 282, and since the heating elements 230 do not share a same power supply line of the plurality of the power supply line and a same power return line of the plurality of power return line, an independent control and simplified connection of the heating element 230 can be actualized.

In addition, a filter FT may be installed at the power supply line 281, for example, at the input side of the heating element 230. The filter FT may selectively filter a power supplied to the heating element 230. In addition, the heating element 230 may be disposed within the support plate 210, more particularly, within a cavity defined by the first insulation layer 210*b* and second insulation layer 210*c*, as described above. The filter FT may be installed outside the first insulation layer 210*b* and the second insulation layer 210 of the support plate 210. The filter FT may be installed outside the support plate 210. The filter FT may be installed outside the chamber 100 if required.

The heating elements 230 may be grouped into a plurality of groups, each group including at least one heating element 230. Each group may include one or more heating elements 230. For example, a first group may include one heating element 230, and a second group different from the first group may include three heating elements 230. The filter FT may correspond to each of the groups.

Hereinafter, it will be described as an example that each group includes one heating element 230.

The filter FT may be provided to correspond to each heating element 230. For example, a plurality of filters FT may be provided and each filter FT may correspond to each of the heating elements 230. A filter FT corresponding to the 1-1 heating element 23011 may be referred to as a 1-1 filter FT11. A filter FT corresponding to the 1-2 heating element 23012 may be referred to as a 1-2 filter FT12. A filter FT corresponding to the M-N heating element 230MN may be referred to as a M-N filter FTMN.

The filter FT may be a band pass filter. Alternatively, the filter FT may be a band reject filter. In addition, the filter FT may be a low pass filter or a high pass filter. In addition, the filter FT may be a filter unit configured with a combination of the above-described filters and may selectively pass a power having a specific frequency band.

The filters FTs may selectively pass or reject a power having different frequency bands. In addition, the filters FTs may have different frequency passing bands without overlapping each other.

Figure 4:
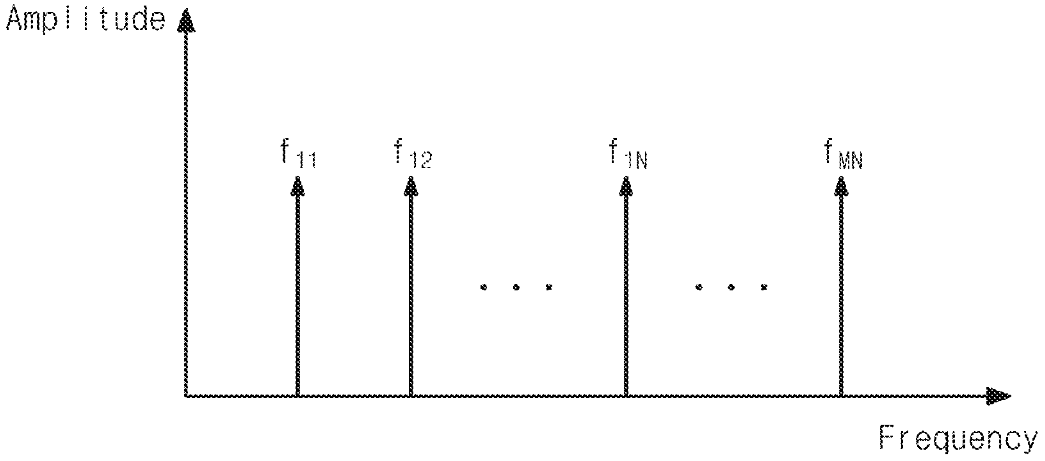
FIG. 4 illustrates a frequency allocation of a power generated by the power supply module of FIG. 3.

For example, as shown in FIG. 4, the power supply module 290 to be described later may generate a 1-1 power having a 1-1 frequency f11. The 1-1 filter FT11 may selectively pass only a power having a band including the 1-1 frequency f11. In addition, the power supply module 290 may generate a 1-2 power having a 1-2 frequency f12. The 1-2 filter FT12 may selectively pass only a power having a band including the 1-2 frequency f12. In addition, the power supply module 290 may generate a M-N power having a M-N frequency fMN. The M-N filter FTMN may selectively pass only a power having a band including the M-N frequency fMN.

Referring back to FIG. 3, the power supply module 290 may supply a power to at least one of the heating elements 230. The power supply module 290 may be configured to generate at least two or more powers having different frequencies.

The power supply module 290 may include a power source 291, a frequency conversion member 293, a switch SW, and a frequency synthesis member 295.

The power source 291 may generate a power. The power source 291 may be an AC power source. The power source 291 may generate a power having a specific frequency. The power source 291 may be electrically connected to at least one frequency conversion member 293. For example, the power source 291 may be electrically connected to two or more frequency conversion members 293.

The frequency conversion member 293 may receive a power of a specific frequency from the power source 291 and convert the power into a power having another specific frequency. For example, the 1-1 frequency conversion member 29311 may receive a power of a specific frequency from the power source 291 and convert it into a power having the 1-1 frequency f11. In addition, the 1-2 frequency conversion member 29312 may receive a power of a specific frequency from the power source 291 and convert it into a power having the 1-2 frequency f12. In addition, the M-N frequency conversion member 293MN may receive a power of a specific frequency from the power source 291 and convert it into a power having the M-N frequency fMN.

A plurality of switches SW may be provided. The switch SW may be provided to correspond to each of the frequency conversion members 293. For example, a 1-1 switch SW11 may selectively connect the 1-1 frequency conversion member 29311 to the frequency synthesis member 295 to be described later. For example, a 1-2 switch SW12 may selectively connect the 1-2 frequency conversion member 29312 to the frequency synthesis member 295 to be described later. For example, the 1-1 switch SW11 may selectively connect the 1-1 frequency conversion member 29311 to the frequency synthesis member 295 to be described later.

The frequency synthesis member 295 may be selectively connected to the frequency conversion member 293. The frequency synthesis member 295 may synthesize a power allocated with a specific frequency by the frequency conversion member 293. For example, if the 1-1 switch SW11 is turned on and remaining switches SW are turned off, a 1-1 power (or current) having the 1-1 frequency f11 may be transmitted to the heating element 230 through the frequency synthesis member 295. For example, when the 1-1 switch SW11 and the 1-2 switch SW12 are turned on and the remaining switches SW are turned off, the 1-1 power (or current) having the 1-1 frequency f11) and 1-2 power (or current) having the 1-2 frequency f12 may be synthesized at the frequency member 295. The power applied to the heating element 230 through the frequency synthesis member 295 may be power having both a component of the 1-1 frequency f11 and a component of the 1-2 frequency f12.

Figure 5:
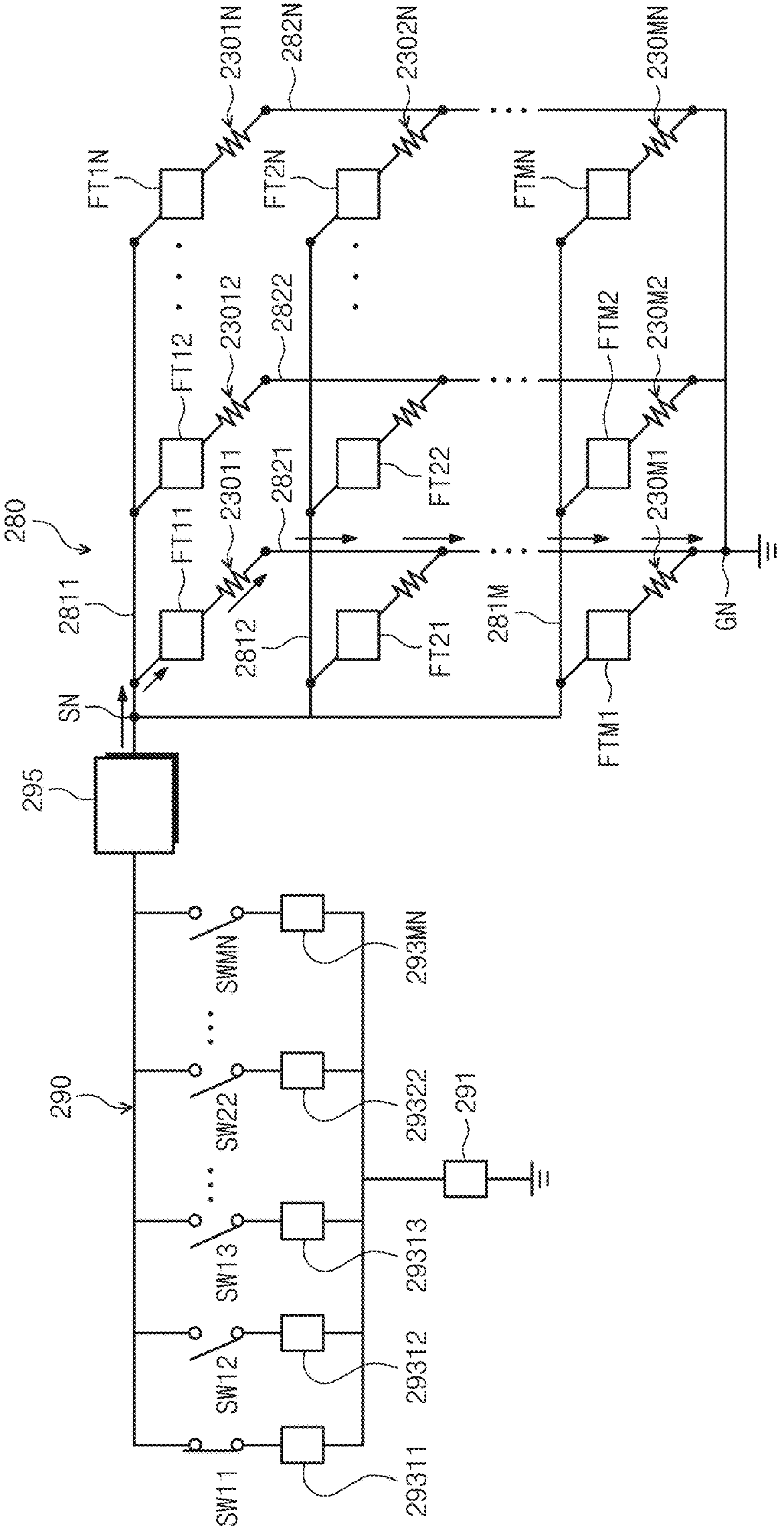
FIG. 5 illustrates an embodiment in which the power supply module of FIG. 3 transfers the power to a heating element.

FIG. 5 illustrates an embodiment in which a power supply module of FIG. 3 transfers a power to a heating element.

Referring to FIG. 5, FIG. 5 shows an embodiment of independently controlling a heat generation of the heating element 230. An example of a case where a 1-1 switch SW1-1 among switches SW is turned on and remaining switches SW are turned off is illustrated in FIG. 5. In this case, a power generated by a power source 291 may be converted into a power having a 1-1 frequency f11 by a 1-1 frequency conversion member 29311, and then transferred to a frequency synthesis member 295. A power having the 1-1 frequency f11 may be transferred to filters FT through power supply lines 2811 via a frequency synthesis member 295. Each filter has respective passing or rejecting frequency band as described above. In the example of FIG. 5, a 1-1 filter FT11 selectively passes power having the 1-1 frequency f11 and the remaining filters FT11 selectively block a power having the 1-1 frequency f11. As a result, a power is applied only to the 1-1 heating element 23011 to generate heat in the 1-1 heating element 23011.

Figure 6:
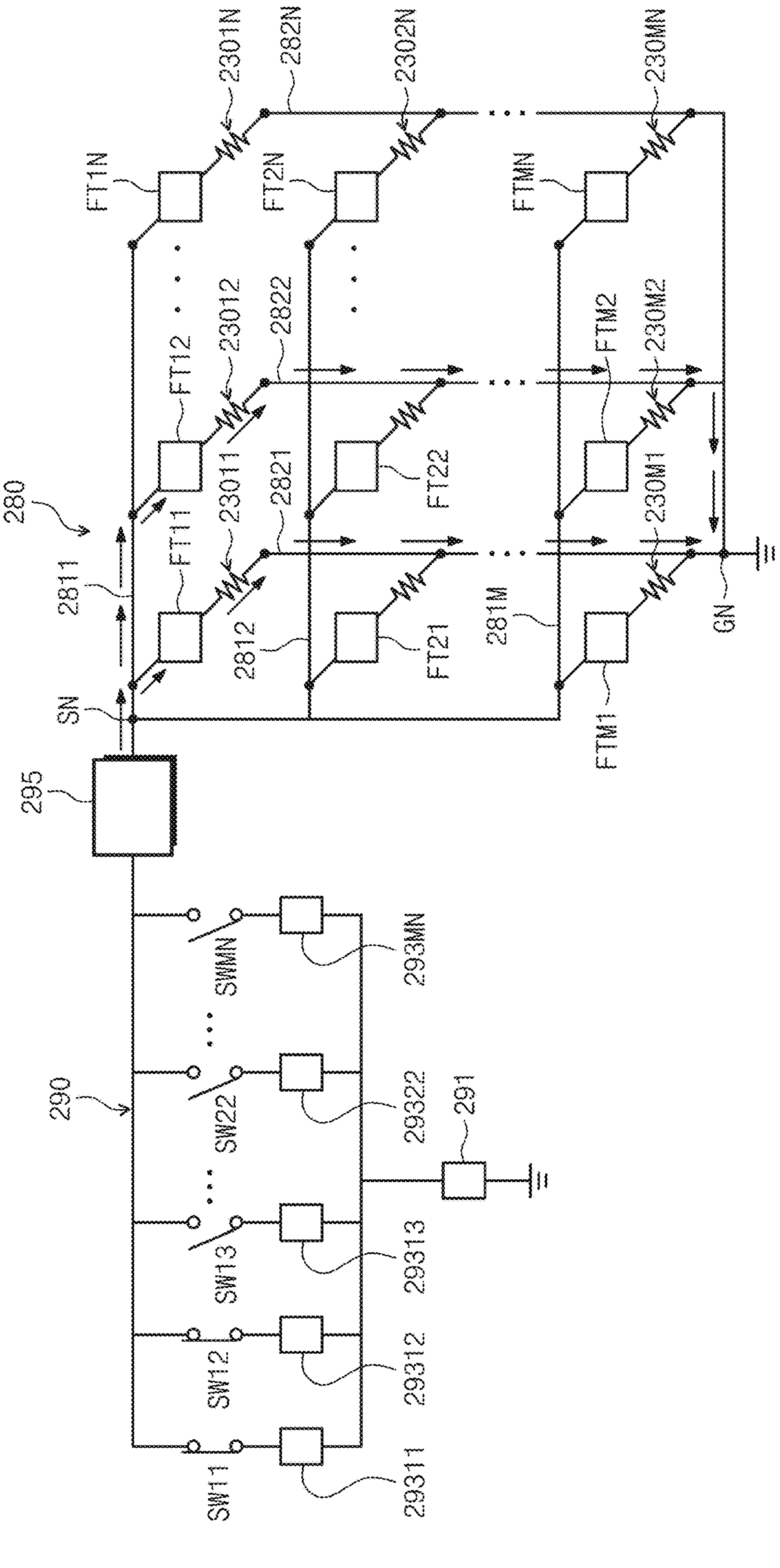
FIG. 6 illustrates another embodiment in which the power supply module of FIG. 3 transfers the power to the heating element.

FIG. 6 illustrates another example in which a power supply module of FIG. 3 transfers a power to a heating element.

Referring to FIG. 6, FIG. 6 shows another example of independently controlling a heat generation of the heating element 230. An example of a case where a 1-1 switch SW1-1 and an 1-2 switch SW1-2 among switches SW are turned on and remaining switches SW are turned off is illustrated in FIG. 6. In this case, a power generated by a power source 291 may be converted into a power having a 1-1 frequency f11 by a 1-1 frequency conversion member 29311, and may be converted into a power having a 1-2 frequency f12 by a 1-2 frequency conversion member 29312. The power having the 1-1 frequency f11 and the power having the 1-2 frequency f12 may be transferred to the frequency synthesis member 295. A power (or a current) transmitted to a power supply line 2811 through the frequency synthesis member 295 may be a power (or a current) having both a component of the 1-1 frequency f11 and a component of the 1-2 frequency f12.

In this case, each filter FT having respective passing frequency band passes only a power having a frequency within passing frequency band. In the example of FIG. 6, a 1-1 filter FT11 selectively passes the power having the 1-1 frequency f11, and the remaining filters FT selectively block the power having the 1-1 frequency f11. As a result, only the f1-1 filter FT11 passes a component of 1-1 frequency f11 while rejecting a component of 1-2 frequency f12 from the incoming power having both a component of the 1-1 frequency f11 and a component of the 1-2 frequency f12 and transfer the power having the 1-1 frequency f11 to the 1-1 heating element 23011.

On the other hand, the 1-2 filter FT12 selectively passes the power having the 1-2 frequency f12, and the remaining filters FT selectively block the power having the 1-2 frequency f12. As a result, only the f1-2 filter FT12 passes a component of 1-2 frequency f12 while rejecting a component of 1-1 frequency f11 from the incoming the power having both a component of the 1-1 frequency f11 and a component of the 1-2 frequency f12 and transfer the power having 1-2 frequency f12 to the 1-2 heating element 23012.

In addition, the remaining filters FT except for the 1-1 filter FT11 and the 1-2 filter FT12 block both the power having the 1-1 frequency f11 and the power having the 1-2 frequency f12. As a result, the power having both the component of the 1-1 frequency f11 and the component of the 1-2 frequency f12 may not be transmitted to the heating elements 230 which are not connected to the 1-1 and 1-2 filters FT11 and FT12.

The control method described above is merely an example. The power may be independently applied to a plurality of heating elements 230 through the above-described power supply module 290, the power line module 280, and the filter FT. In addition, since it is not necessary to install a separate switch at the power supply line 281 or the power return line 282, a connection can be very simplified. In addition, since a power transmitted to the heating element 230 may be independently controlled only by a control of the power supply module 290, a heating of the substrate W for each region may be performed more efficiently.

A Second Exemplary Embodiment

Except for a configuration of a support unit 200 according to a second embodiment, other configurations of a substrate treating apparatus 10 may be the same as, or at least similar to, those described in the first embodiment.

Figure 7:
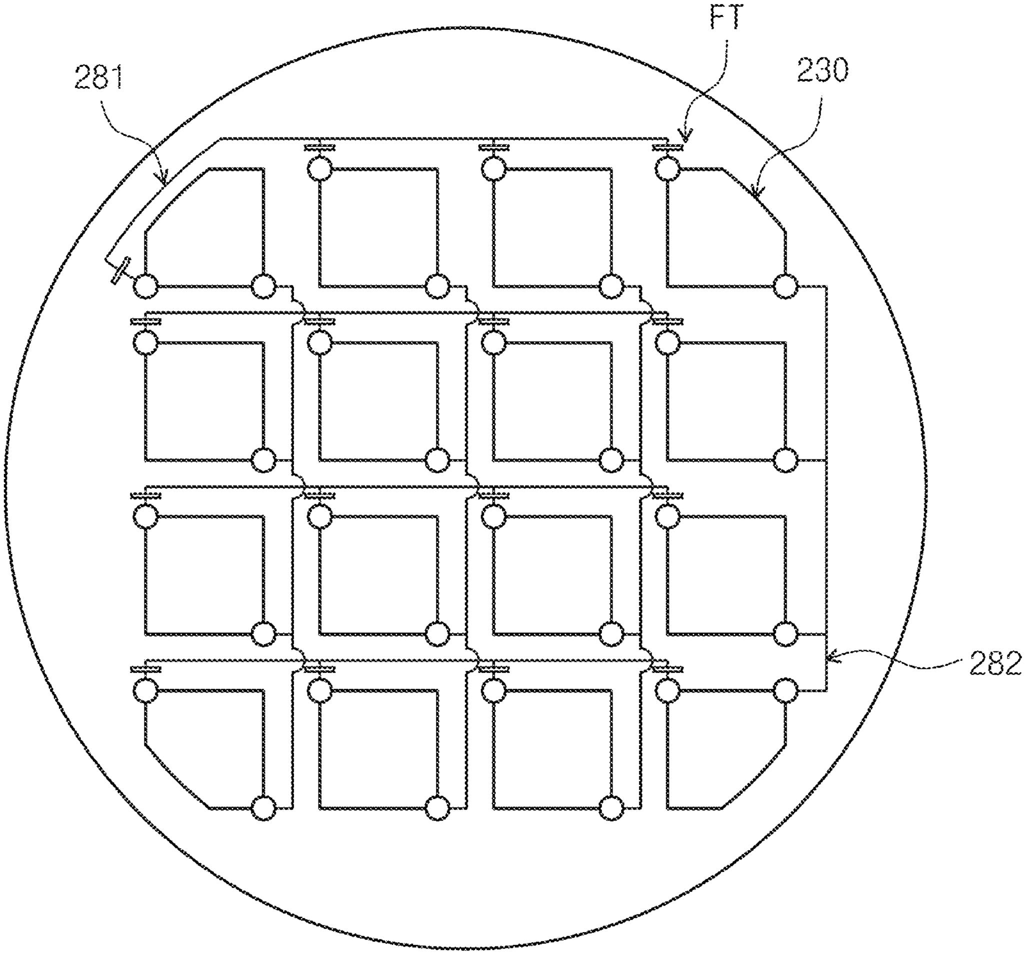
FIG. 7 is a top view of a plane of the support unit according to a second embodiment of the inventive concept.

FIG. 7 is a top view of a plane of the support unit according to the second embodiment of the inventive concept.

Referring to FIG. 7, a filter FT may be disposed within the support plate 210. For example, the filter FT may be provided between a first insulation layer 210*b* and a second insulation layer 210*c* between which a heating element 230 is provided. That is, in the above-described example, the heating element 230 is disposed in a cavity formed by the first insulation layer 210*b* and the second insulation layer 210*c*, but the filter FT may also be disposed in the cavity formed by the first insulation layer 210*b* and the second insulation layer 210*c*.

A Third Exemplary Embodiment

Except for a configuration of a support unit 200 according to a third embodiment, other configurations of a substrate treating apparatus 10 may be the same as, or at least similar to, those described in the first embodiment.

Figure 8:
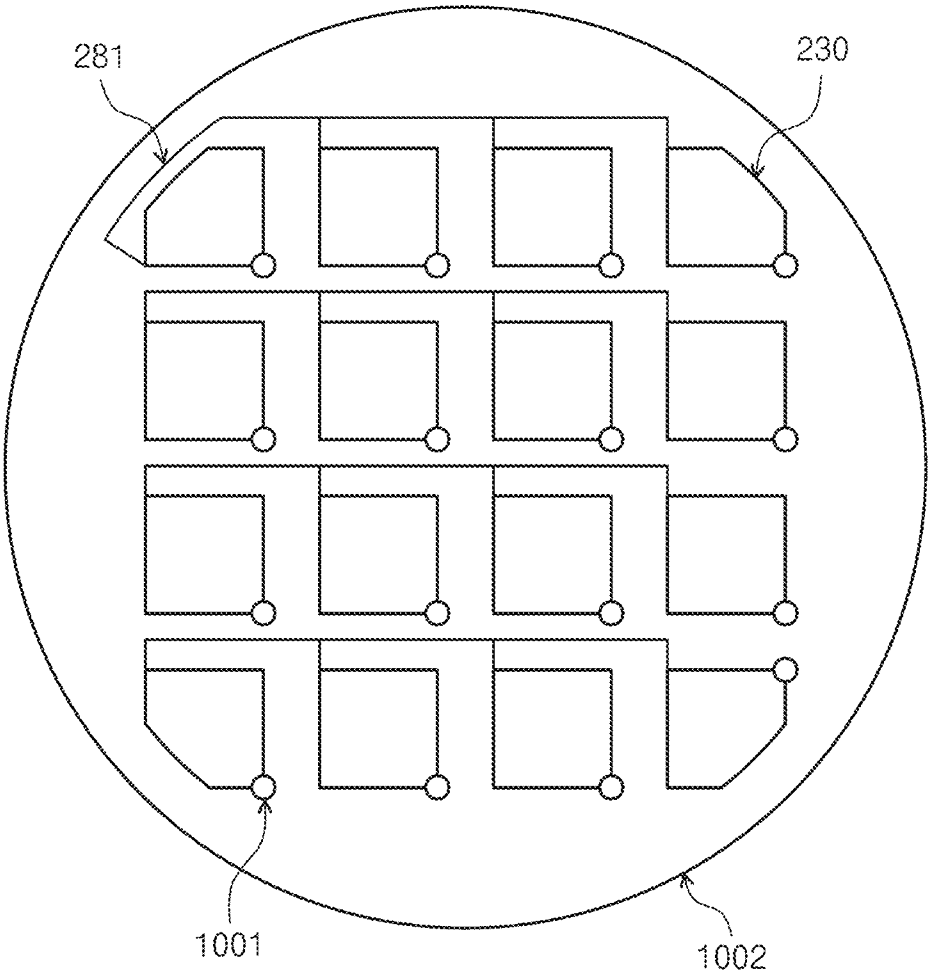
FIG. 8 is a top view of a first plane of the support unit according to a third embodiment of the inventive concept.
Figure 9:
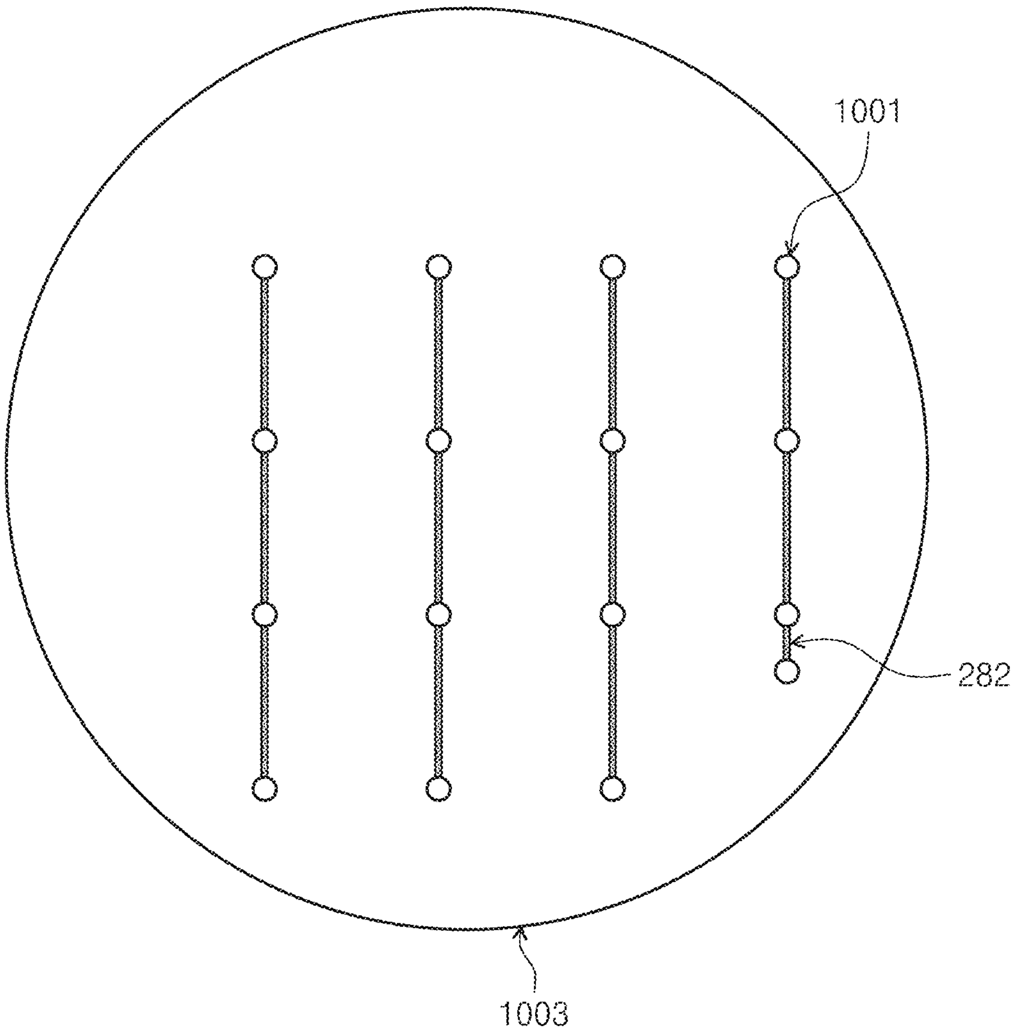
FIG. 9 is a top view of a second plane of the support unit of FIG. 8.
Figure 10:
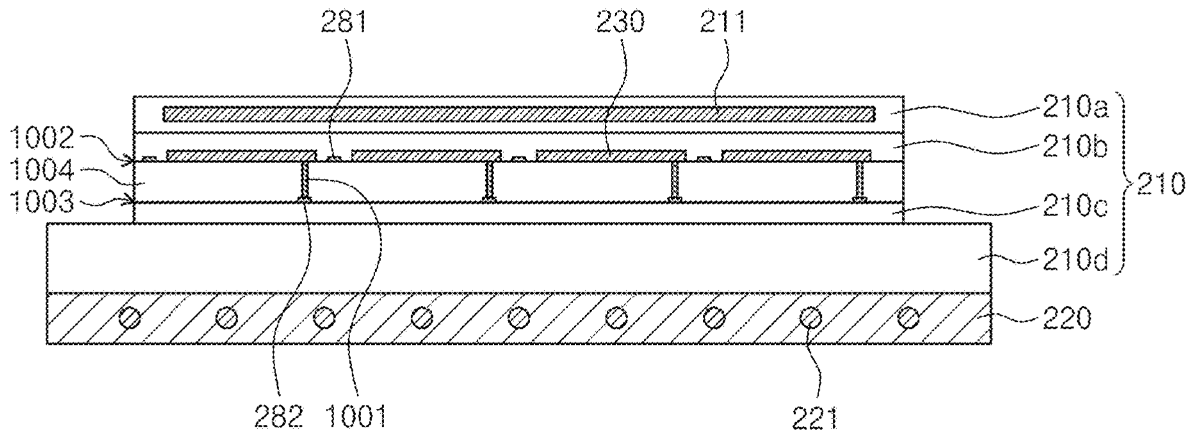
FIG. 10 is a cross-sectional view of the support unit of FIG. 8.

FIG. 8 is a top view of a first plane of the support unit according to the third embodiment of the inventive concept, FIG. 9 is a top view of a second plane of the support unit of FIG. 8, and FIG. 10 is a cross-sectional view of the support unit of FIG. 8. Specifically, FIG. 8 is a top view of the first plane 1002 of the support plate 210, and FIG. 9 is a top view of the second plane 1003 of the support plate 210.

Referring to FIG. 8 to FIG. 10, the support plate 210 may include a first insulation layer 210*b*, a second insulation layer 210*c*, and a third insulation layer 1004 disposed between the first insulation layer 210*b* and the second insulation layer 210*c*. That is, the first insulation layer 210*b*, the third insulation layer 1004, and the second insulation layer 210*c* can be sequentially stacked and provided in a direction from a top to a bottom.

The heating element 230 may be provided at the first insulation layer 210*b*. The power supply line 281 may be provided at the first insulation layer 210*b*. The power return line 282 may be provided at the third insulation layer 1004. Since both the heating element 230 and the power supply line 281 are provided at the first insulation layer 210*b* the heating element 230 and the power supply line 281 may be electrically connected to each other. Since the heating element 230 and the power return line 282 are provided at different insulation layers, a support unit 200 according to the third embodiment may be provided with a conductive via 1001 for electrically connecting the heating elements 230 and the power return line 282. The conductive vias 1001 may correspond to each of the heating elements 230. The conductive vias 1001 may be provided in a number corresponding to the heating elements 230.

A Fourth Exemplary Embodiment

Except for a configuration of a support unit 200 according to a fourth embodiment, other configurations of a substrate treating apparatus 10 may be the same as, or at least similar to, those described in a first embodiment.

Figure 11:
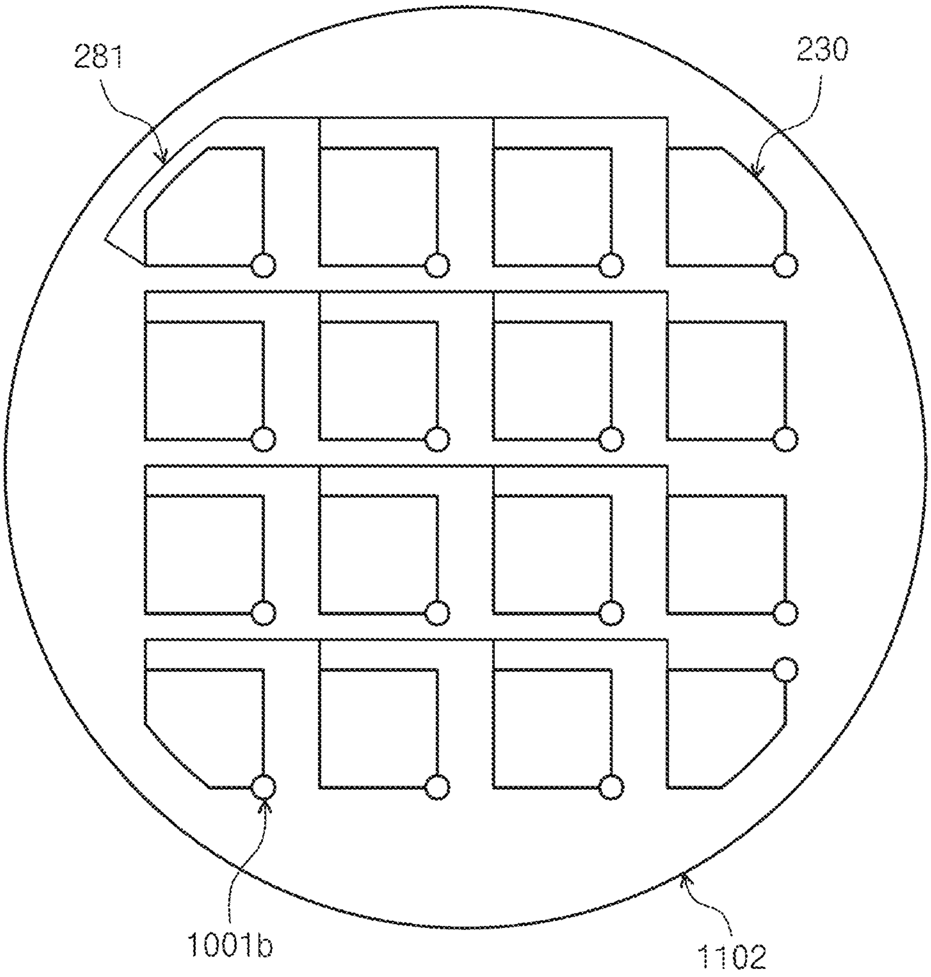
FIG. 11 is a top view of the first plane of the support unit according to a fourth embodiment of the inventive concept.
Figure 12:
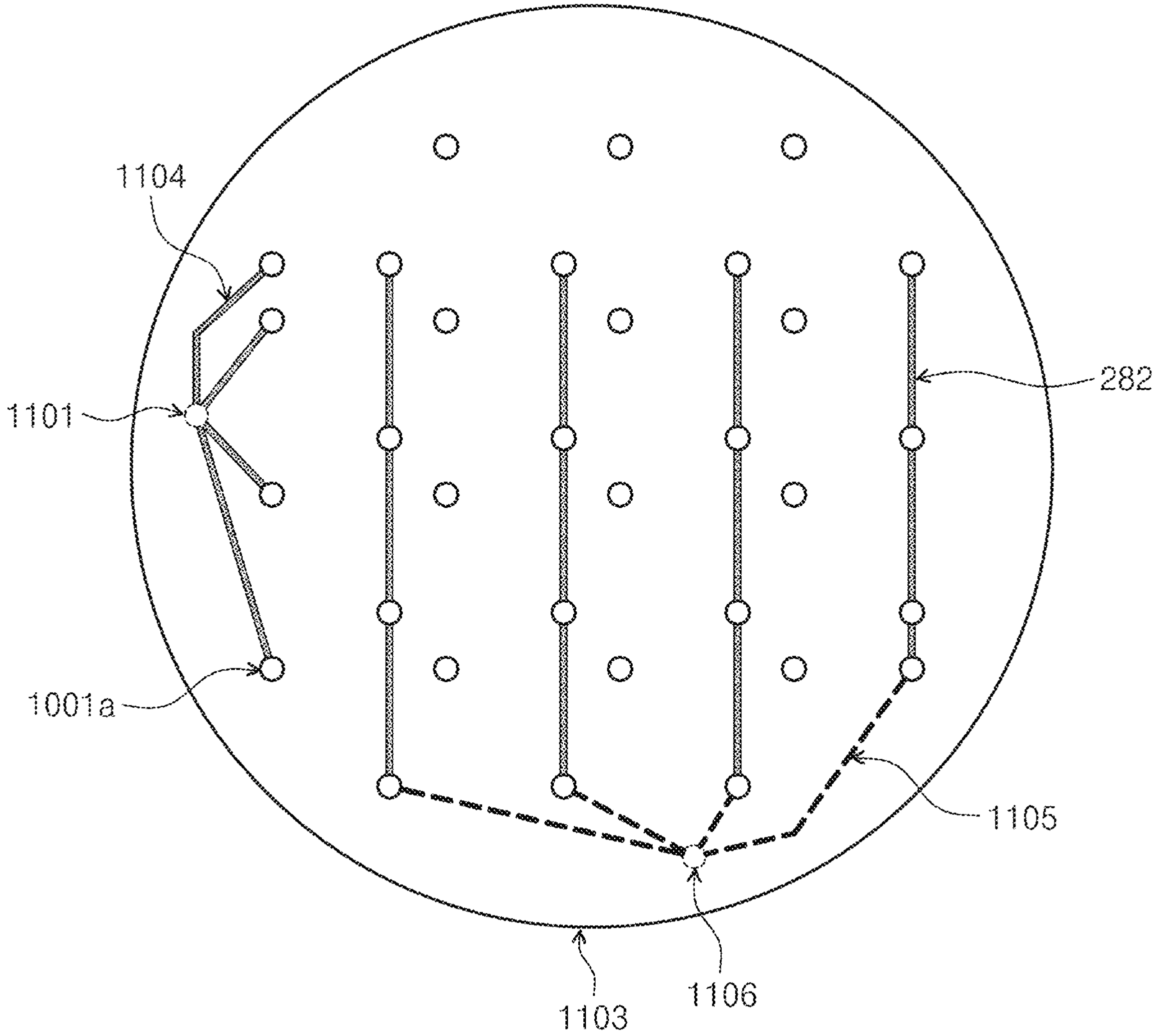
FIG. 12 is a top view of the second plane of FIG. 11.

FIG. 11 is a top view of a first plane of a support unit according to the fourth embodiment of the inventive concept. FIG. 12 is a top view of a second plane of FIG. 11.

Referring to FIG. 11 and FIG. 12, both power supply lines 281 and heating elements 230 may be provided on a first plane 1102. On the other hand, power return lines 282 may be provided on a second plane 1103. The first plane 1102 and the second plane 1103 may be separated from each other by an insulation layer.

The power supply lines 281 may be electrically connected to first leads 1104 within the second plane 1103 through first conductive vias 1001*a* extending between the first plane 1102 and the second plane 1103. The first vias 1104 may pass through respective first hole 1101 formed in an electrode plate 220 that can be a cooling plate while maintaining an electrical insulation therebetween.

The power return lines 282 may be electrically connected to second leads 1105 within the first plane 1103 through second conductive vias 1001*b* extending between the first plane 1102 and the second plane 1103. The second vias 1005 can pass through a second hole 1106 formed on the electrode plate 220 that can be a cooling plate while maintaining the electrical insulation therebetween. When the heating element 230, the power supply line 281, and the power return line 282 are disposed as described above, a number of holes formed at the electrode plate 220 may be reduced, thereby improving a temperature uniformity with respect to the substrate W.

A Fifth Exemplary Embodiment

Except for a configuration of a support unit 200 according to a fifth embodiment, other configurations of a substrate treating apparatus 10 may be the same as, or at least similar to, those described in a first embodiment.

Figure 13:
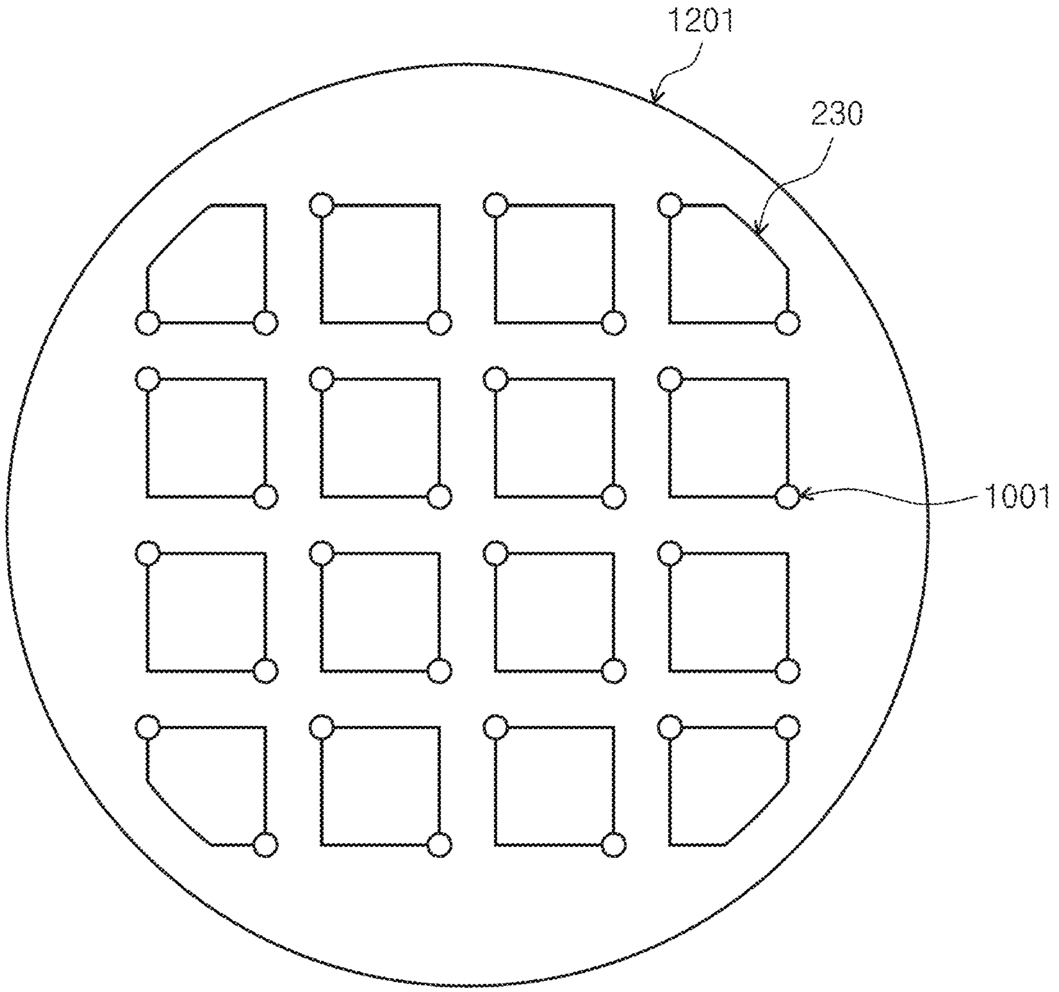
FIG. 13 is a top view of the first plane of the support unit according to a fifth embodiment of the inventive concept.
Figure 14:
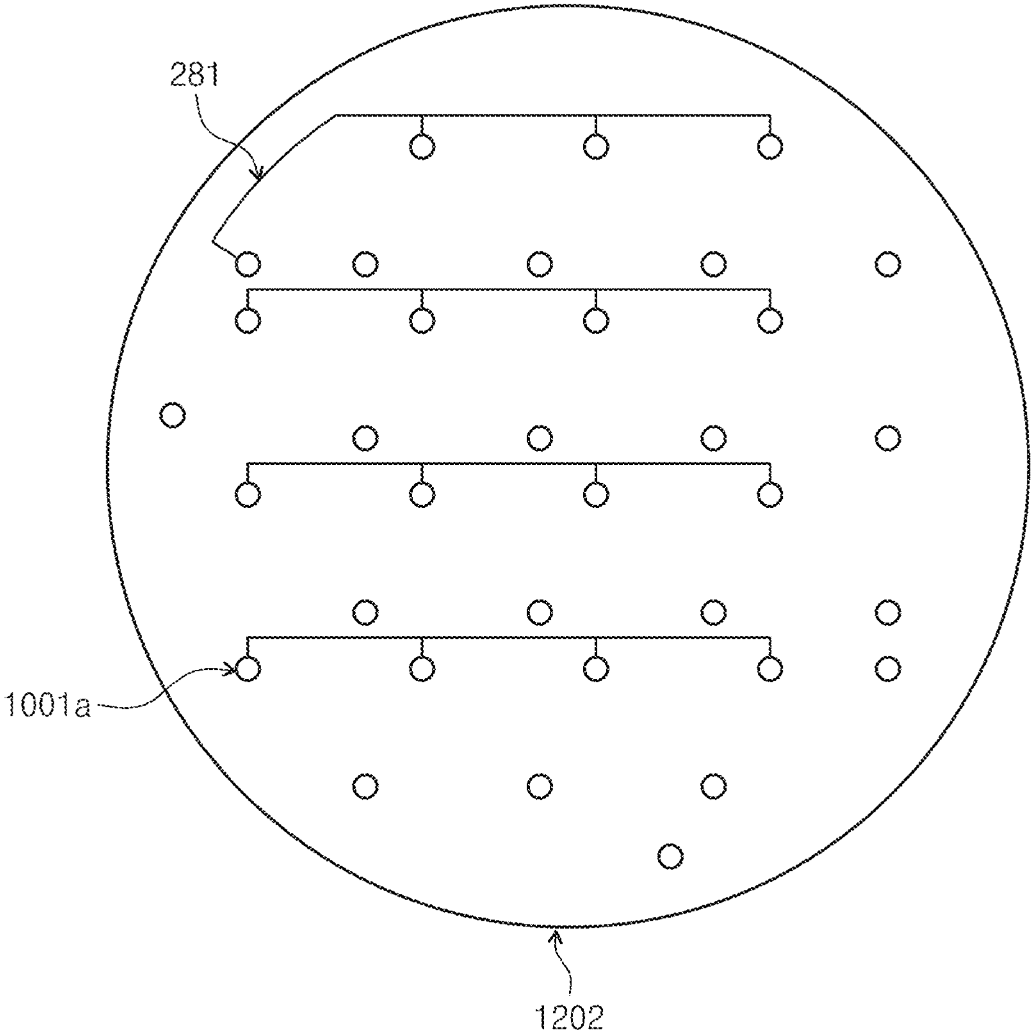
FIG. 14 is a top view of the second plane of the support unit of FIG. 13.
Figure 15:
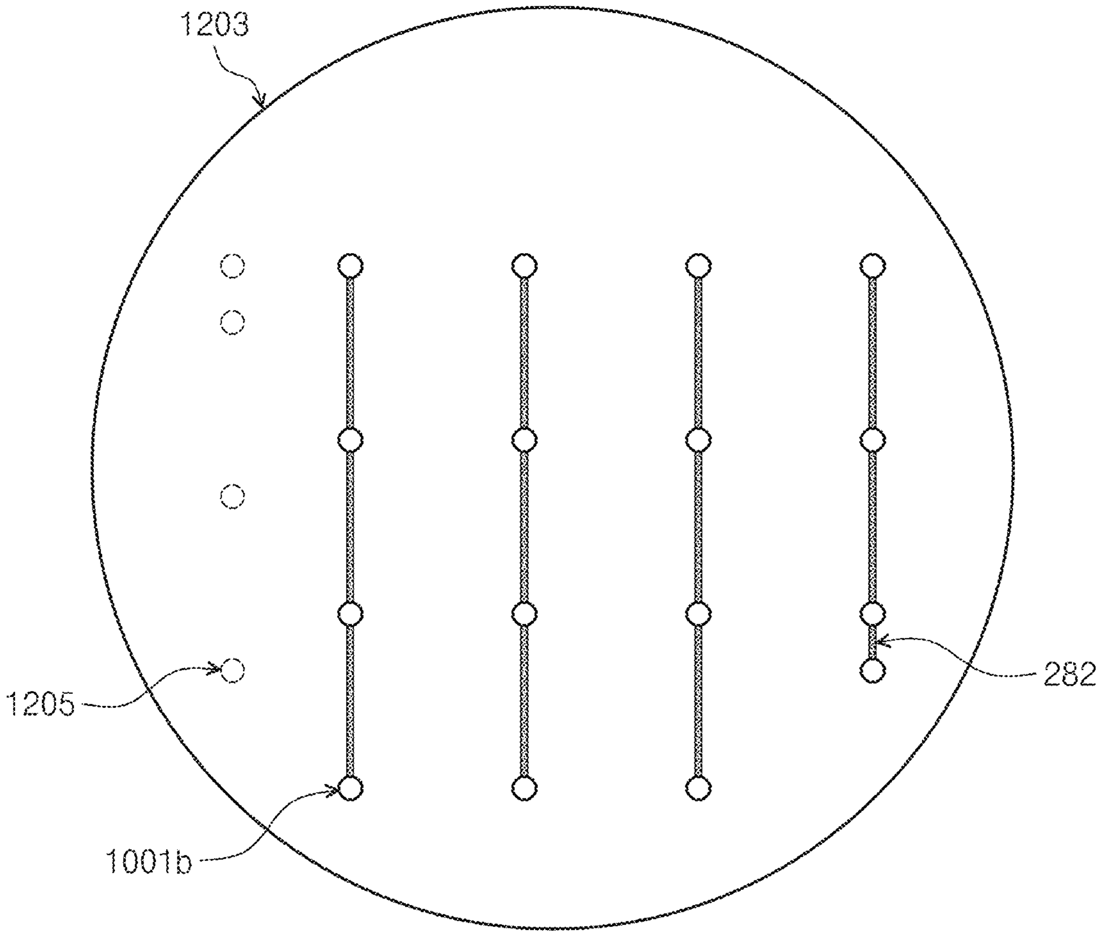
FIG. 15 is a top view of a third plane of the support unit of FIG. 13.
Figure 16:
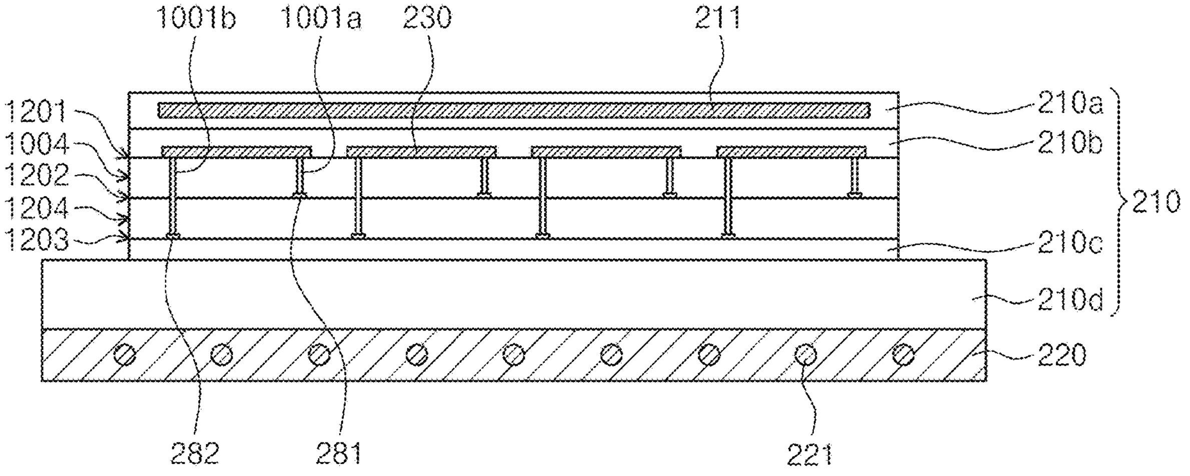
FIG. 16 is a cross-sectional view of the support unit of FIG. 13.

FIG. 13 is a top view of a first plane of the support unit according to the fifth embodiment of the inventive concept, FIG. 14 is a top view of a second plane of the support unit of FIG. 13, FIG. 15 is a top view of a third plane of the support unit of FIG. 13, and FIG. 16 is a cross-sectional view of the support unit of FIG. 13.

Specifically, FIG. 13 is a view of the first plane 1201 of the support plate 210, FIG. 14 is a top view of the second plane 1202 of the support plate 210, and FIG. 15 is a top view of the third plane 1203 of the support plate 210.

Referring to FIG. 13 to FIG. 16, the support unit 200 according to the fifth embodiment may further include a third insulation layer 1004 and a fourth insulation layer 1204 provided between the first insulation layer 210*b* and the second insulation layer 210*c*. The third insulation layer 1004 may be disposed below the first insulation layer 210*b*, the fourth insulation layer 1204 may be disposed below the third insulation layer 1004, and the second insulation layer 210*c* may be disposed below the fourth insulation layer 1204.

The heating elements 230 may be provided at the first insulation layer 210*b*. A power supply line 281 may be provided at the third insulation layer 1004. A power return line 282 may be provided at the fourth insulation layer 1204. In addition, the support unit 200 may include a plurality of first conductive vias 1001*a* for electrically connecting the heating elements 230 provided at the first insulation layer 210*b* to the power supply lines 281 provided at the third insulation layer 1004. In addition, the support unit 200 may include a plurality of second conductive vias 1001*b* that electrically connect the heating elements 230 provided at the first insulation layer 210*b* to the power return lines 282 provided at the fourth insulation layer 1204.

A Sixth Exemplary Embodiment

Except for a configuration of the support unit 200 according to a sixth embodiment, other configurations of a substrate treating apparatus 10 may be the same as, or at least similar to, those described in a first embodiment.

Figure 17:
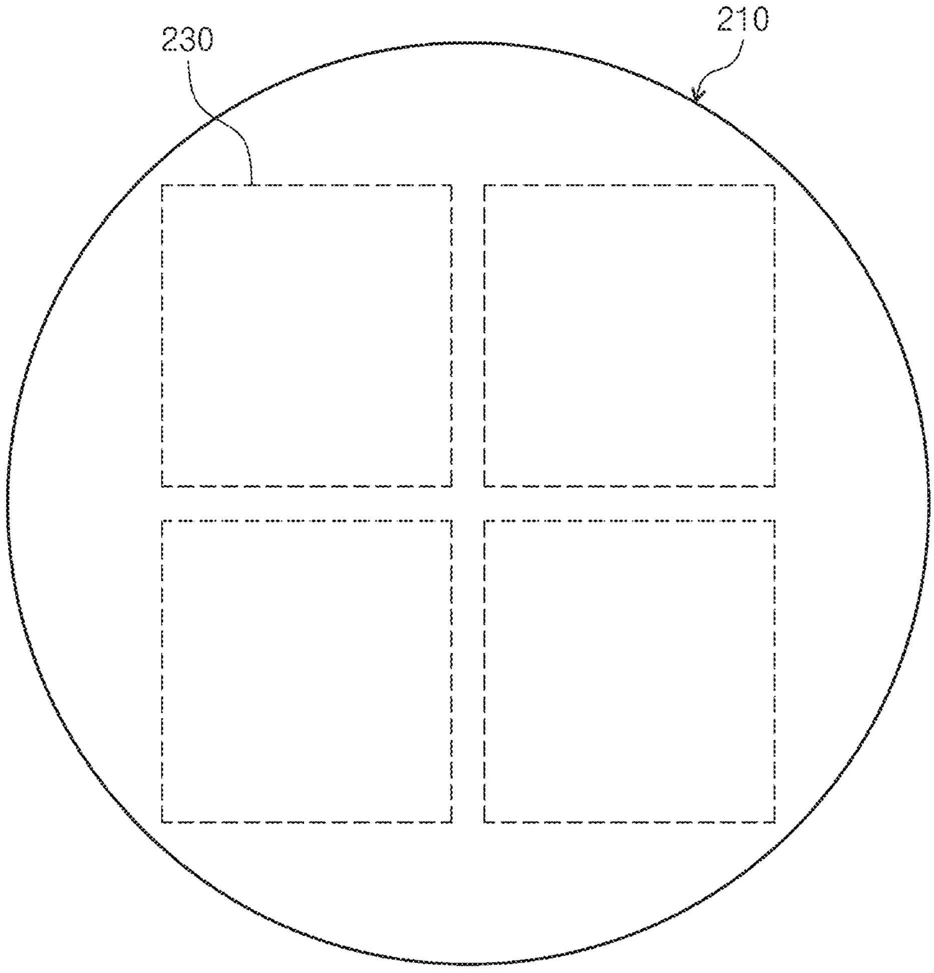
FIG. 17 schematically illustrates an arrangement of the heating element of the support unit according to a sixth embodiment of the inventive concept.

FIG. 17 schematically illustrates an arrangement of a heating element of the support unit according to the sixth embodiment of the inventive concept.

In the above-described example, it has been described that the heating element 230 is provided in a 4×4 array. The arrangement of the heating elements 230 may include a 2×2 array as illustrated in FIG. 17.

A Seventh Exemplary Embodiment

Except for a configuration of a support unit 200 according to a seventh embodiment, other configurations of a substrate treating apparatus 10 may be the same as, or at least similar to, those described in a first embodiment.

Figure 18:
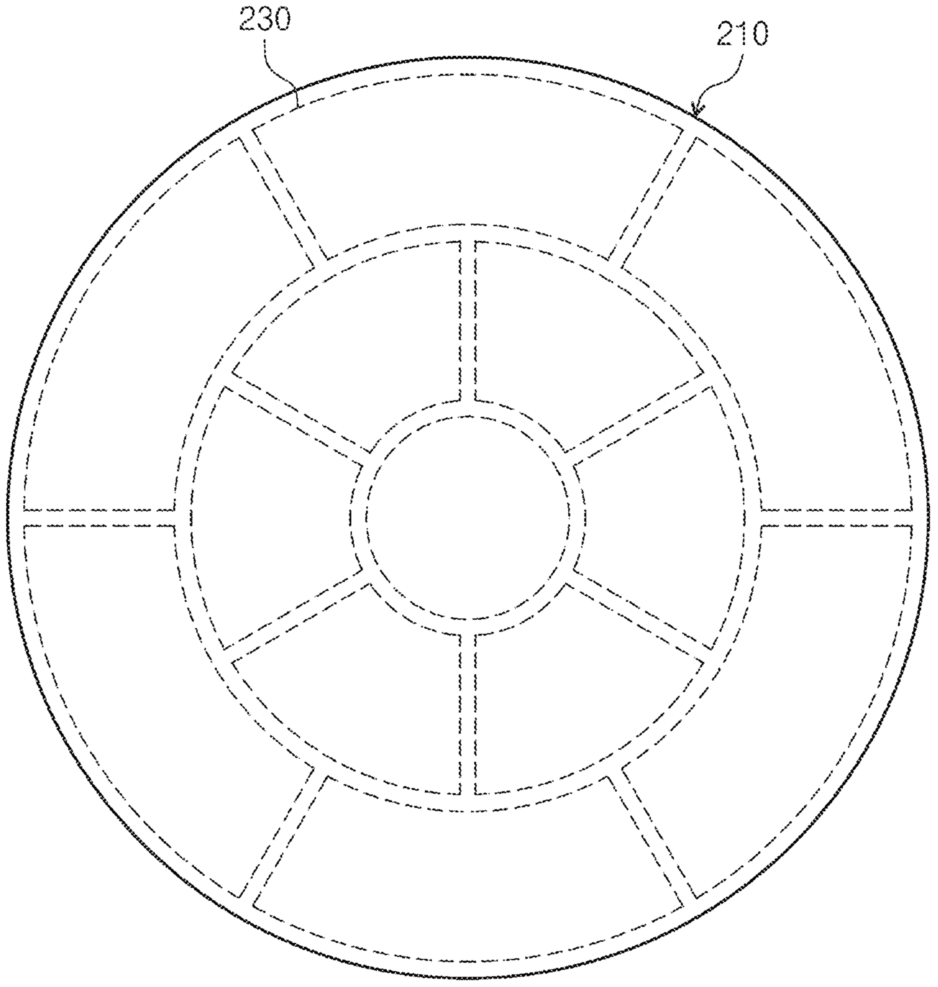
FIG. 18 schematically illustrates an arrangement of the heating element of the support unit according to a seventh embodiment of the inventive concept.

FIG. 18 schematically illustrates an arrangement of a heating element of the support unit according to the seventh embodiment of the inventive concept.

In the above-described example, the heating element 230 is arranged in a matrix form, but the inventive concept is not limited thereto. For example, as illustrated in FIG. 18, some of the heating elements 230 may be disposed in a center region of the support plate 210 when viewed from above, and others of the heating elements 230 may be disposed in an edge region of the support plate 210. The heating elements 230 disposed at the edge region of the support plate 210 may be divided into a group disposed in a first edge region adjacent to the center region and a group disposed in a second edge region farther from the central region of the support plate 210 than the first edge region. Also, the heating elements 230 disposed in the edge region of the support plate 210 may be spaced apart from each other along a circumferential direction of the plate 210 when viewed from above.

An Eighth Exemplary Embodiment

Except for a configuration of a support unit 200 according to an eighth embodiment, other configurations of a substrate treating apparatus 10 may be the same as, or at least similar to, those described in a first embodiment.

Figure 19:
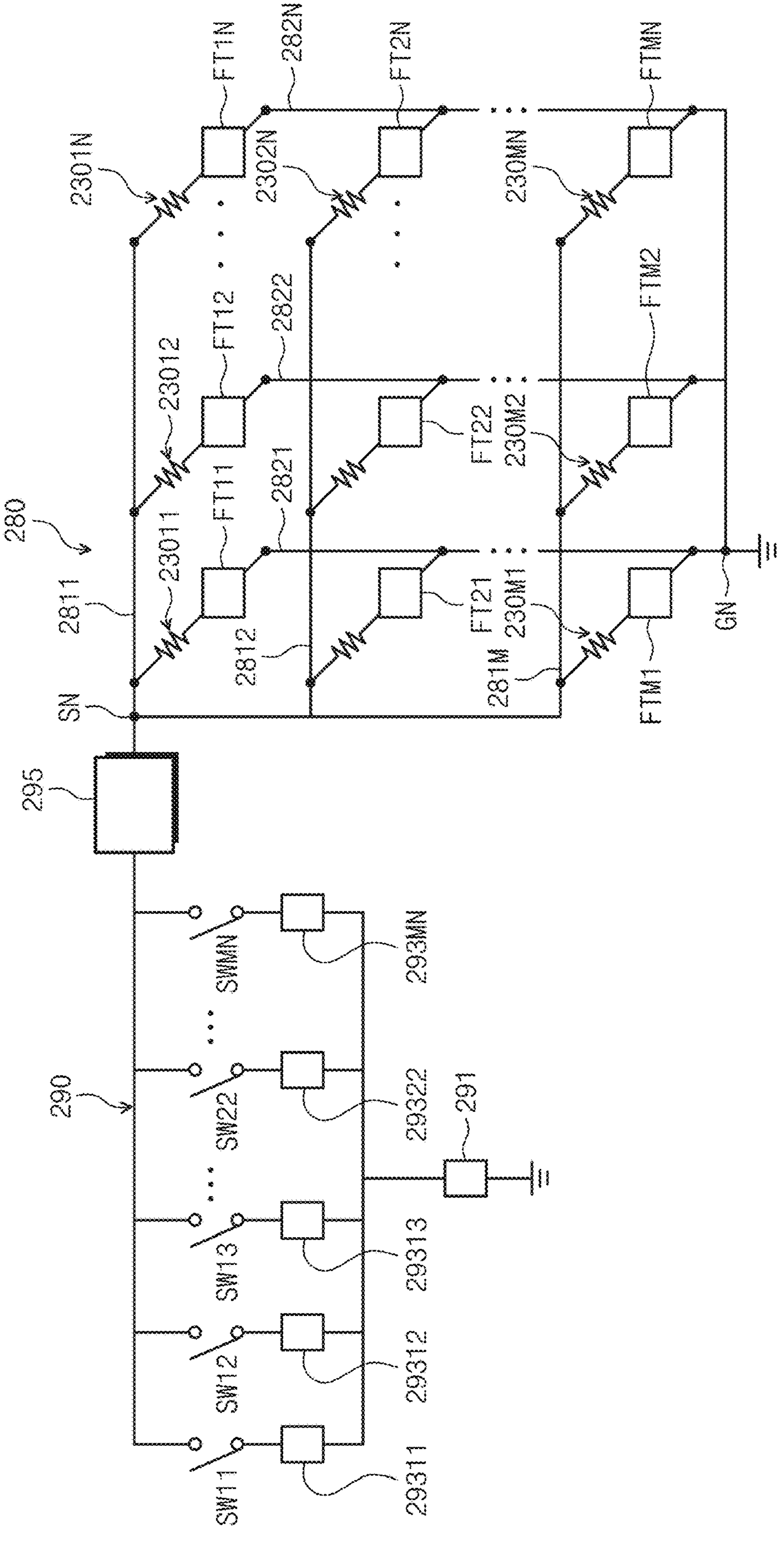
FIG. 19 is a view schematically showing the power line module, the power supply module, the filter, and heating elements of the support unit according to an eighth embodiment of the inventive concept.

FIG. 19 is a view schematically showing a power line module, a power supply module, a filter, heating elements, and rectifier of a support unit according to the eighth embodiment of the inventive concept.

Figure 20:
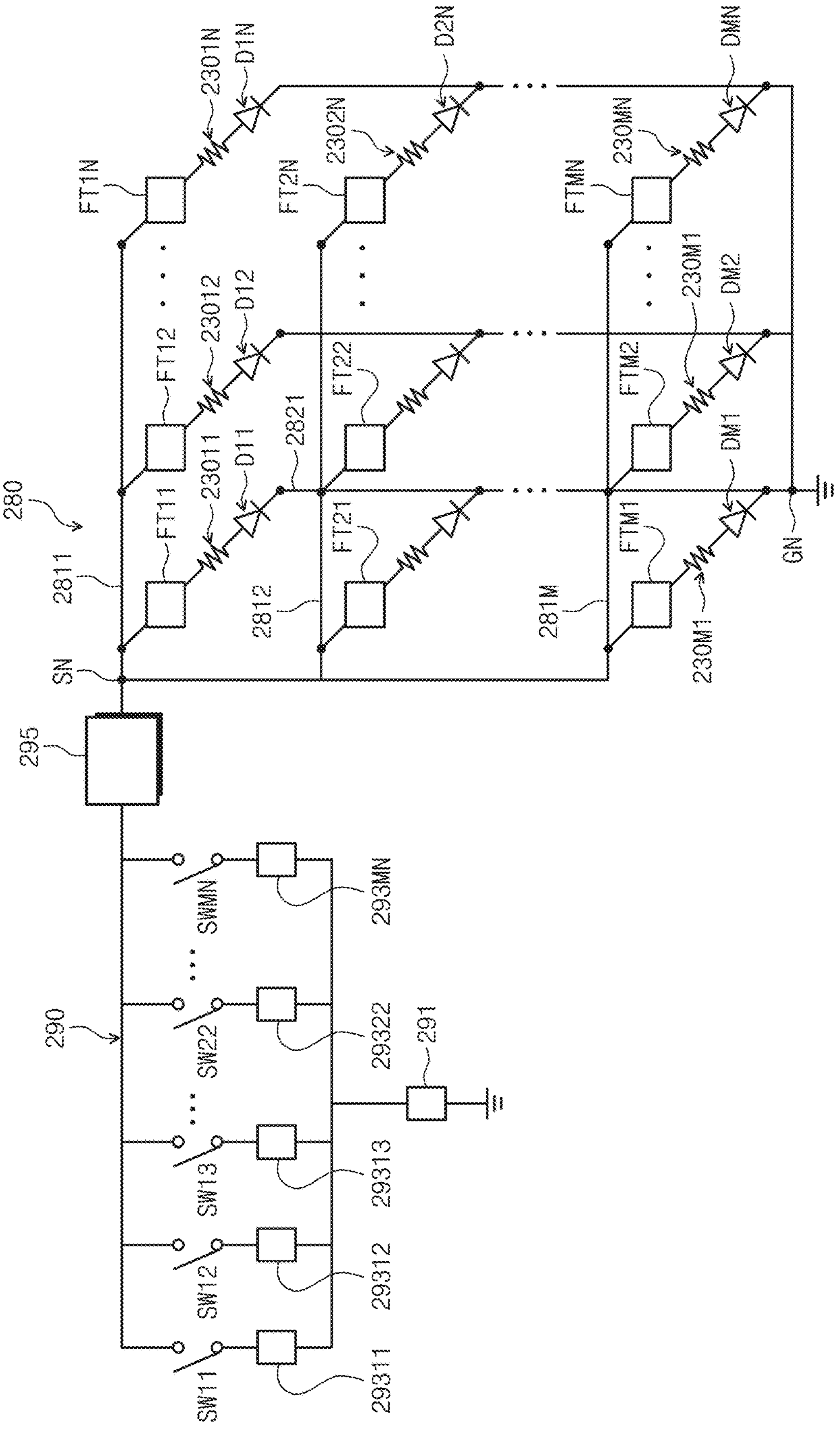
FIG. 20 is a view schematically showing the power line module, the power supply module, the filter, heating elements, and a rectifier of the support unit according to the eighth embodiment of the inventive concept.

In the above-described example, the filter FT is installed at a power supply line 281 at the input side of the heating element 230 as an example, but is not limited thereto. For example, as shown in FIG. 20, the filter FT may be installed at the power return line 282 at the output side of the heating element 230. The power supply line 281 and the power return line 282 may be collectively referred to as a power line.

A Ninth Exemplary Embodiment

Except for a configuration of a support unit 200 according to a ninth embodiment, other configurations of a substrate treating apparatus 10 may be the same as, or at least similar to, those described in a first embodiment.

FIG. 20 is a view schematically showing a power line module, a power supply module, a filter, heating elements, and a rectifier of the support unit according to the ninth embodiment of the inventive concept.

In the above-described example, the filter FT is installed at the power line as an example, but the inventive concept is not limited thereto. The rectifier D may be installed at the power line as shown in FIG. 20. The rectifier D may be installed at the power supply line 281 or the power return line 282. The rectifier D may be a diode that prevents a current transmitted by the power supply module 290 from flowing in a reverse direction. The rectifier D may be provided in a number corresponding to the heating element 230. A rectifier corresponding to a 1-1th heating element 23011 may be referred to as a 1-1 rectifier D11, a rectifier corresponding to a 1-2th heating element 23011 may be referred to as a 1-2th rectifier D12, and a rectifier corresponding to a M-Nth heating element 23011 may be referred to as an M-N rectifier DMN.

A Tenth Exemplary Embodiment

Except for a configuration of a support unit 200 according to a tenth embodiment, other configurations of a substrate treating apparatus 10 may be the same as, or at least similar to, those described in a first embodiment.

Figure 21:
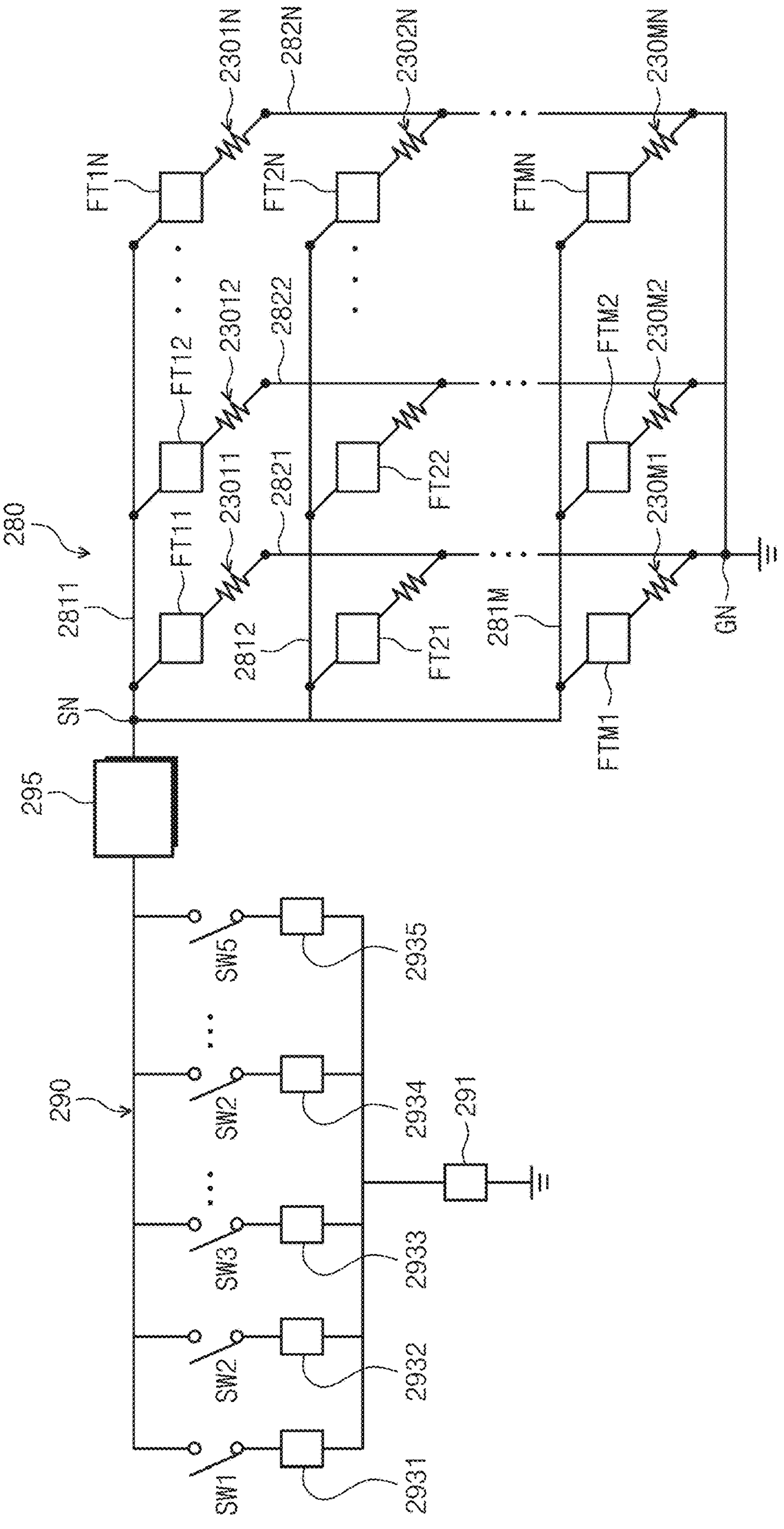
FIG. 21 is a view schematically showing the power line module, the power supply module, the filter, and heating elements of the support unit according to a tenth embodiment of the inventive concept.
Figure 22:
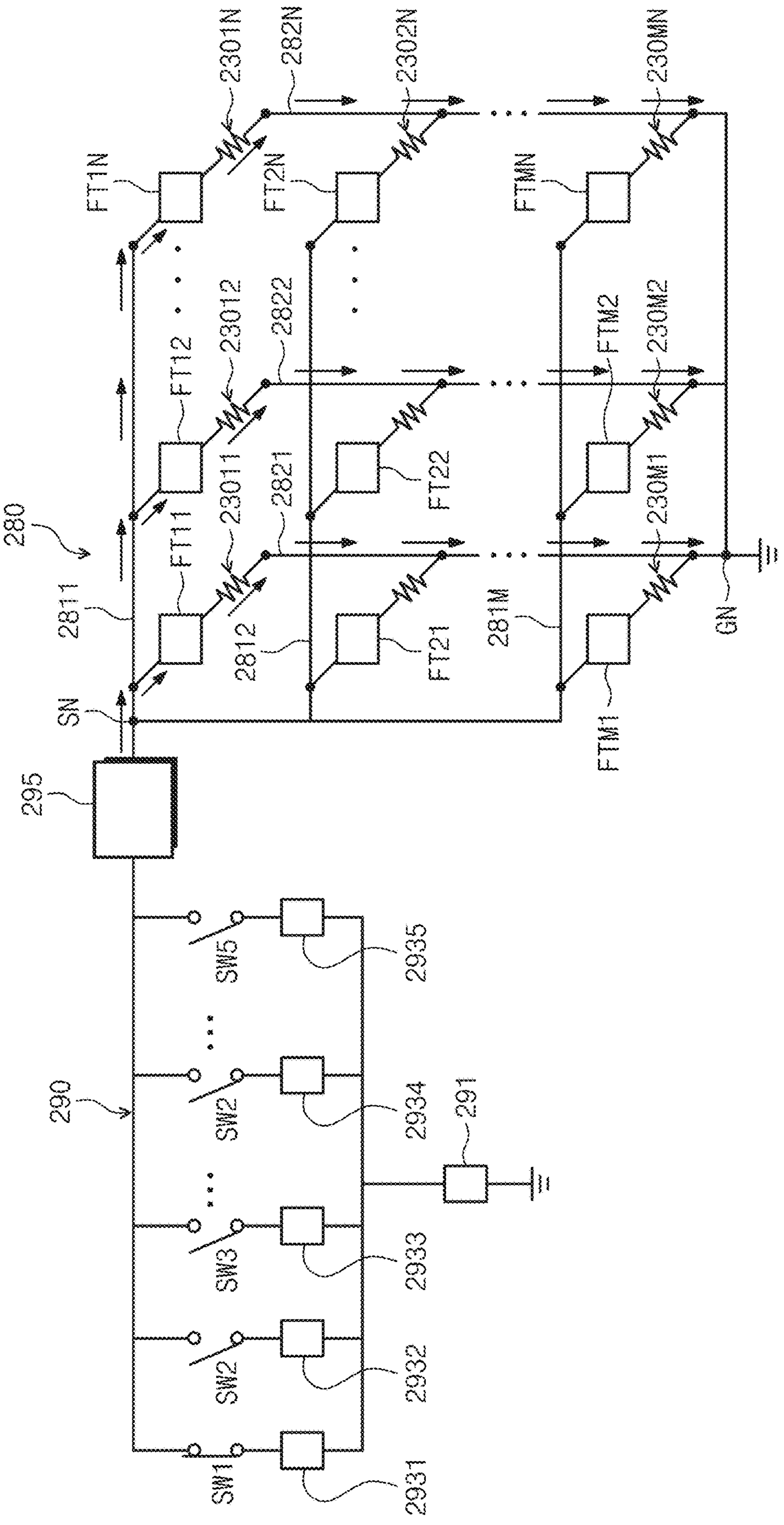
FIG. 22 illustrates an embodiment in which the power supply module of FIG. 21 transfers the power to the heating element.

FIG. 21 schematically illustrates a power line module, a power supply modules, a filter, and heating elements of the support unit according to the tenth embodiment of the inventive concept, and FIG. 22 illustrates an embodiment in which the power supply module of FIG. 21 transfers a power to a heating element.

In the above-described example, filters FT pass different frequency band from one another, but the inventive concept is not limited thereto. For example, at least two of the filters FT may have the same frequency passing band. For example, as illustrated in FIG. 21 and FIG. 22, filters FT disposed in the same row may have the same frequency passing band, and thus, even when only a first switch SW is turned on, the power may be applied to the heating elements 230 disposed in a first row among the plurality of heating elements 230. This is only an example, and according to a group control request for the heating elements 230, a grouping of filters FTs having the same frequency passing band may be variously modified. As described above, when at least some of the filters FT have the same frequency passing band, a number of switches may be reduced, and a control structure of the heating element 230 may be further simplified.

In the above-described example, it has been described that a power source 291 is an AC power source, but the inventive concept is not limited thereto. For example, the power source 291 may be a DC power source.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a chamber providing a treating space for treating a substrate therein;

a support unit configured to support the substrate in the treating space; and a plasma source configured to generate a plasma for treating the substrate at the treating space, and wherein the support unit comprises:

heating elements configured to control a temperature of the substrate, the heating elements being independently operable;

a power supply module configured to generate at least two powers having a different frequency;

power supply lines connecting the power supply module to the heating elements;

power return lines connecting the heating elements to a ground;

filters installed at the power supply lines, wherein the power supply module comprises:

a power source:

a plurality of frequency conversion members connected to the power source and configured to convert a power generated by the power source to a power having a specific frequency;

a plurality of switches respectively corresponding to the plurality of frequency conversion members; and a frequency synthesizing member selectively connectable to the plurality of frequency conversion members, the frequency synthesizing member configured to synthesize the power of the specific frequency from at least one selectively connected frequency conversion member.

2. The substrate treating apparatus of claim 1, wherein each of the heating elements is connected to any one of the power supply lines and any one of the power return lines, and wherein the heating elements do not share a same one of the power supply lines and a same one of the power return lines.

3. The substrate treating apparatus of claim 1, wherein a rectifier is installed at the power supply lines or the power return lines, the rectifier configured to prevent a current transmitted from the power supply module from flowing in a reverse direction.

4. The substrate treating apparatus of claim 1, wherein the support unit further comprises a first plate including an upper insulation layer provided with the heating elements and a lower insulation layer provided with the power return lines, the heating elements connected to respective ones of the power return lines by return conductive vias.

5. The substrate treating apparatus of claim 1, further comprising a plurality of rectifiers respectively corresponding to the filters and installed at the power supply lines or the power return lines, each of the plurality of rectifiers being configured to prevent a current transmitted from the power supply module from flowing in a reverse direction.

* * * * *